(12) United States Patent
Hsu et al.

(10) Patent No.: US 12,035,475 B2
(45) Date of Patent: Jul. 9, 2024

(54) SEMICONDUCTOR PACKAGE WITH STRESS REDUCTION DESIGN AND METHOD FOR FORMING THE SAME

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Po-Chen Lai, Hsinchu County (TW); Po-Yao Lin, Zhudong Township, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 407 days.

(21) Appl. No.: 17/396,253

(22) Filed: Aug. 6, 2021

(65) Prior Publication Data
US 2022/0361338 A1    Nov. 10, 2022

Related U.S. Application Data

(60) Provisional application No. 63/185,621, filed on May 7, 2021.

(51) Int. Cl.
*H05K 1/18* (2006.01)
*H01L 25/065* (2023.01)
(Continued)

(52) U.S. Cl.
CPC ......... *H05K 1/181* (2013.01); *H01L 25/0655* (2013.01); *H05K 3/284* (2013.01);
(Continued)

(58) Field of Classification Search
CPC ..... H01L 23/28; H01L 23/31; H01L 23/3171; H01L 23/3157; H01L 23/3185
See application file for complete search history.

(56) References Cited

U.S. PATENT DOCUMENTS

2007/0267757 A1* 11/2007 Nakagawa ............. H01L 24/05
257/E21.503
2010/0208442 A1* 8/2010 Asano ............... H01L 23/49822
361/783
(Continued)

FOREIGN PATENT DOCUMENTS

TW      201727854 A    8/2017
TW      201820573 A    6/2018
(Continued)

*Primary Examiner* — Kenneth Parker
*Assistant Examiner* — Moataz Khalifa
(74) *Attorney, Agent, or Firm* — Birch, Stewart, Kolasch & Birch, LLP

(57) ABSTRACT

A semiconductor package and a method of forming the same are provided. The semiconductor package includes a package substrate, a semiconductor device, an underfill element, and a groove. The semiconductor device is bonded to the surface of the package substrate through multiple electrical connectors. The underfill element is formed between the semiconductor device and the surface of the package substrate to surround and protect the electrical connectors. The underfill element includes a fillet portion that extends laterally beyond the periphery of the semiconductor device and is formed along the periphery of the semiconductor device. The groove is formed in the fillet portion and spaced apart from the periphery of the semiconductor device.

20 Claims, 20 Drawing Sheets

(51) Int. Cl.
*H05K 3/28* (2006.01)
*H01L 23/00* (2006.01)
*H01L 23/31* (2006.01)
*H01L 23/498* (2006.01)
*H01L 23/538* (2006.01)
*H05K 3/34* (2006.01)

(52) U.S. Cl.
CPC ..... *H01L 23/3185* (2013.01); *H01L 23/49811* (2013.01); *H01L 23/5383* (2013.01); *H01L 24/73* (2013.01); *H01L 24/92* (2013.01); *H01L 24/97* (2013.01); *H01L 2224/73204* (2013.01); *H01L 2224/92125* (2013.01); *H01L 2224/95001* (2013.01); *H05K 3/3436* (2013.01); *H05K 2201/10378* (2013.01); *H05K 2201/10727* (2013.01); *H05K 2201/10734* (2013.01); *H05K 2201/10977* (2013.01); *H05K 2203/107* (2013.01)

(56) References Cited

U.S. PATENT DOCUMENTS

| | | | | |
|---|---|---|---|---|
| 2016/0027712 | A1* | 1/2016 | Hu | H01L 23/49833 |
| | | | | 174/262 |
| 2016/0233141 | A1* | 8/2016 | Hirobe | H01L 23/04 |
| 2016/0233175 | A1* | 8/2016 | Dubey | H01L 29/06 |
| 2017/0084511 | A1 | 3/2017 | Lee et al. | |
| 2017/0309579 | A1* | 10/2017 | Wang | H01L 23/3114 |
| 2017/0358554 | A1* | 12/2017 | Chen | H01L 21/6835 |
| 2021/0082761 | A1* | 3/2021 | Tomono | H01L 23/3121 |
| 2023/0420314 | A1* | 12/2023 | Wang | H01L 23/49811 |

FOREIGN PATENT DOCUMENTS

| | | |
|---|---|---|
| TW | 201839925 A | 11/2018 |
| TW | 202111882 A | 3/2021 |

* cited by examiner

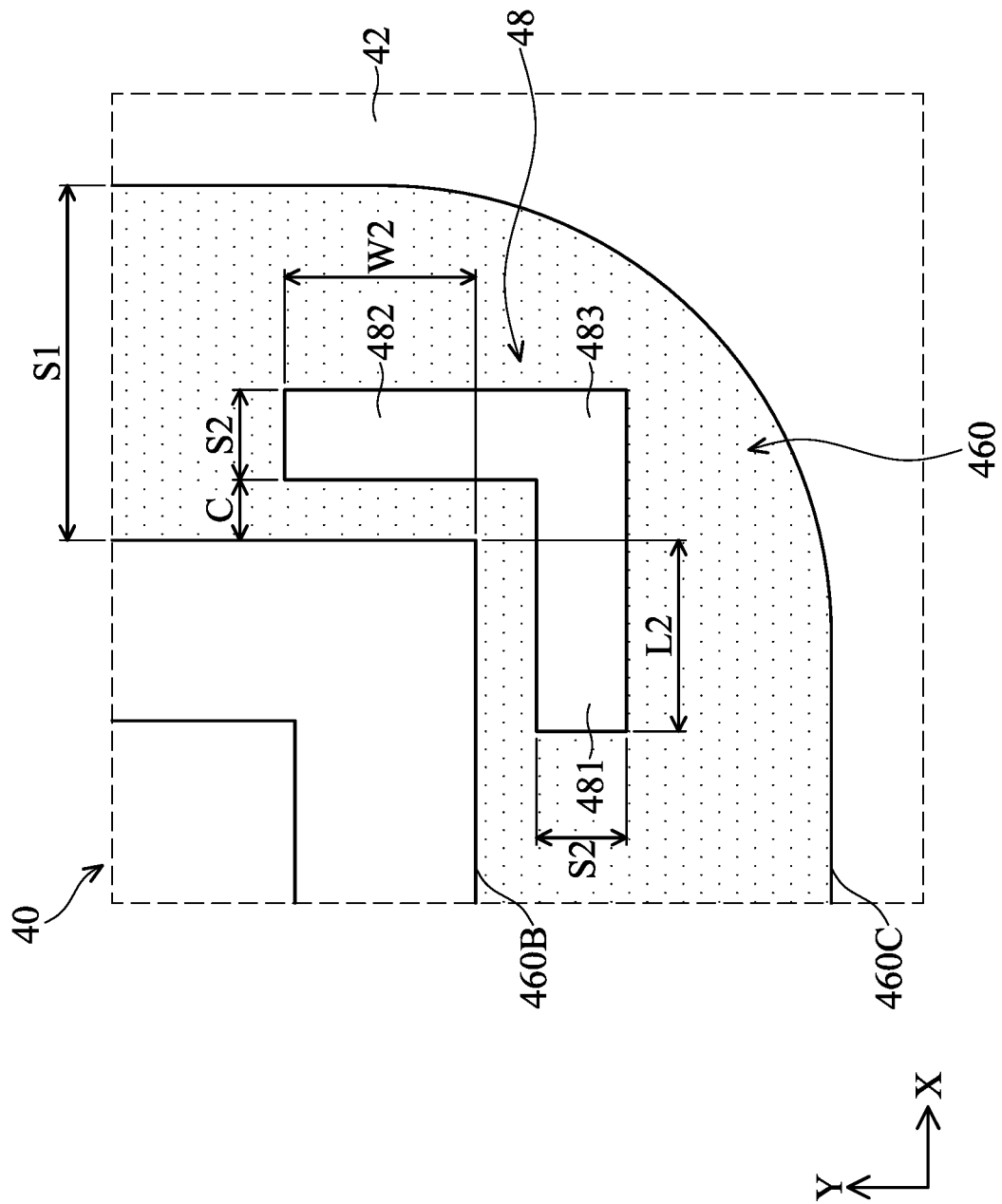

SEMICONDUCTOR PACKAGE WITH STRESS REDUCTION DESIGN AND METHOD FOR FORMING THE SAME

CROSS REFERENCE TO RELATED APPLICATIONS

This application claims priority of U.S. Provisional Patent Application No. 63/185,621, filed on May 7, 2021, the entirety of which is incorporated by reference herein.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

One smaller type of packaging for semiconductors is a flip chip chip-scale package (FcCSP), in which a semiconductor die is placed upside-down on a substrate and bonded to the substrate using conductive bumps. An underfill element is generally applied into the gaps formed by the conductive bumps in order to secure the semiconductor die to the substrate. The substrate has wiring routed to connect the bumps on the semiconductor die to contact pads on the substrate that have a larger footprint. An array of solder balls is formed on the opposite side of the substrate and is used to electrically connect the packaged semiconductor die to an end application.

Although existing packaging techniques have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2D illustrates an enlarged view of region B in FIG. 2C, showing an L-shaped groove.

DETAILED DESCRIPTION

Figure 1A:
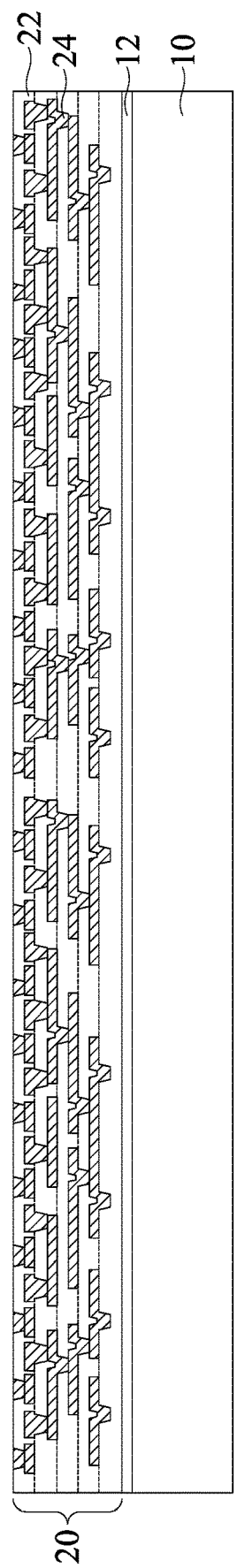
FIGS. 1A-II illustrate cross-sectional views of various intermediate stages of the formation of a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

A semiconductor package and the method for forming the same are provided in accordance with various embodiments of the present disclosure. Some variations of some embodiments are discussed. Throughout the various views and illustrative embodiments, like reference numbers are used to designate like elements.

In accordance with some embodiments, a semiconductor package has a design to reduce the stress in the package, which includes forming one or more grooves in the underfill fillet accumulated at the edges of the semiconductor device packaged on the package substrate. The grooves may be arranged according to the high stress regions in the semiconductor package in some embodiments, which will be described in further detail below. Through the groove(s), the coupling effect of the underfill element between the package substrate and the semiconductor device is reduced, so that the stress generated in the package during thermal cycling can be reduced or relieved. As a result, the risk of damage (for example, cracking or delamination) to devices or components in the package can also be reduced, thereby improving the reliability of the entire package.

Embodiments will be described with respect to a specific context, namely a packaging technique with an interposer substrate or other active chip in a two and a half dimensional integrated circuit (2.5DIC) structure or a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

FIGS. 1A-1I illustrate cross-sectional views of various intermediate stages of the formation of a semiconductor package in accordance with some embodiments. Some corresponding processes are also reflected schematically in the process flow shown in FIG. 9.

FIG. 1A illustrates the formation of an interposer 20 over a carrier 10 in accordance with some embodiments. The carrier 10 is used to provide temporary mechanical and structural support for the processing of build-up layers or structures during subsequent processing steps. The carrier 10 may be a glass carrier, a silicon wafer, an organic carrier, or the like, and may have a round top-view shape in accordance with some embodiments.

In accordance with some embodiments, a release film 12 may be formed on the carrier 10 before the formation of the interposer 20, as shown in FIG. 1A. The release film 12 may be formed of a polymer-based material (such as a Light-To-Heat-Conversion (LTHC) material), which is capable of being decomposed under heat-carrying radiation such as a laser beam, so that the carrier 10 may be de-bonded from the overlying structures that will be formed in subsequent processes. In the present embodiments, the release film 12 is formed of an epoxy-based thermal-release material, which is coated onto the carrier 10.

The interposer 20 is formed on the release film 12 in accordance with some embodiments. The interposer 20 is used to provide electrical connection between semiconductor dies packaged in the package structure and a package substrate, which will be described later. In some embodiments, the interposer 20 is an interposer wafer, which is free from active devices (such as transistors and diodes) and passive devices (such as resistors, capacitors, inductors, or the like). In some alternative embodiments, the interposer 20 is a device wafer including active and/or passive devices thereon or therein.

In accordance with some embodiments, the interposer 20 is a dielectric substrate including a redistribution line (RDL) structure, shown in FIG. 1A. The RDL structure may include several laminated insulating layers 22 and several conductive features 24 surrounded by the insulating layers 22. The conductive features 24 may include conductive lines providing electrical connection in horizontal directions, conductive vias providing electrical connection in vertical directions, and contact pads exposed at opposite outermost surfaces of the interposer 20 to provide external electrical connection. It should be understood that the configuration of the RDL structure shown in FIG. 1A is merely a schematic example, and is not intended to be, and should not be constructed to be, limiting to the present disclosure.

The insulating layers 22 may be made of or include one or more polymer materials. The polymer material may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 22. In some other embodiments, some or all of the insulating layers 22 are made of or include dielectric materials other than polymer materials. The dielectric material may include silicon oxide, silicon carbide, silicon nitride, silicon oxynitride, one or more other suitable materials, or a combination thereof.

The conductive features 24 may be made of or include copper, aluminum, gold, cobalt, titanium, nickel, silver, graphene, one or more other suitable conductive materials, or a combination thereof. In some embodiments, the conductive features 24 include multiple sub-layers. For example, each of the conductive features 24 contains multiple sub-layers including Ti/Cu, Ti/Ni/Cu, Ti/Cu/Ti, Al/Ti/Ni/Ag, other suitable sub-layers, or a combination thereof.

The formation of the RDL structure may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

In some other embodiments (not shown), the interposer 20 is a semiconductor substrate, which may be a bulk semiconductor substrate, a silicon-on-insulator (SOI) substrate, a germanium-on-insulator (GOI) substrate, or the like. The semiconductor material of the interposer 20 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used. The interposer 20 may be doped or undoped.

Multiple through-vias (TVs) may be formed in and penetrating through the semiconductor substrate to provide electrical connection between devices mounted on opposite sides of the interposer 20. One or more interconnect structure layers (similar to the RDL structure illustrated in FIG. 1A above) may be further formed on one or both sides of the semiconductor substrate of interposer 20 so as to facilitate routing. The processes for forming the through-vias and/or the interconnect structure layers are well known in the art and therefore not described herein.

Figure 1B:
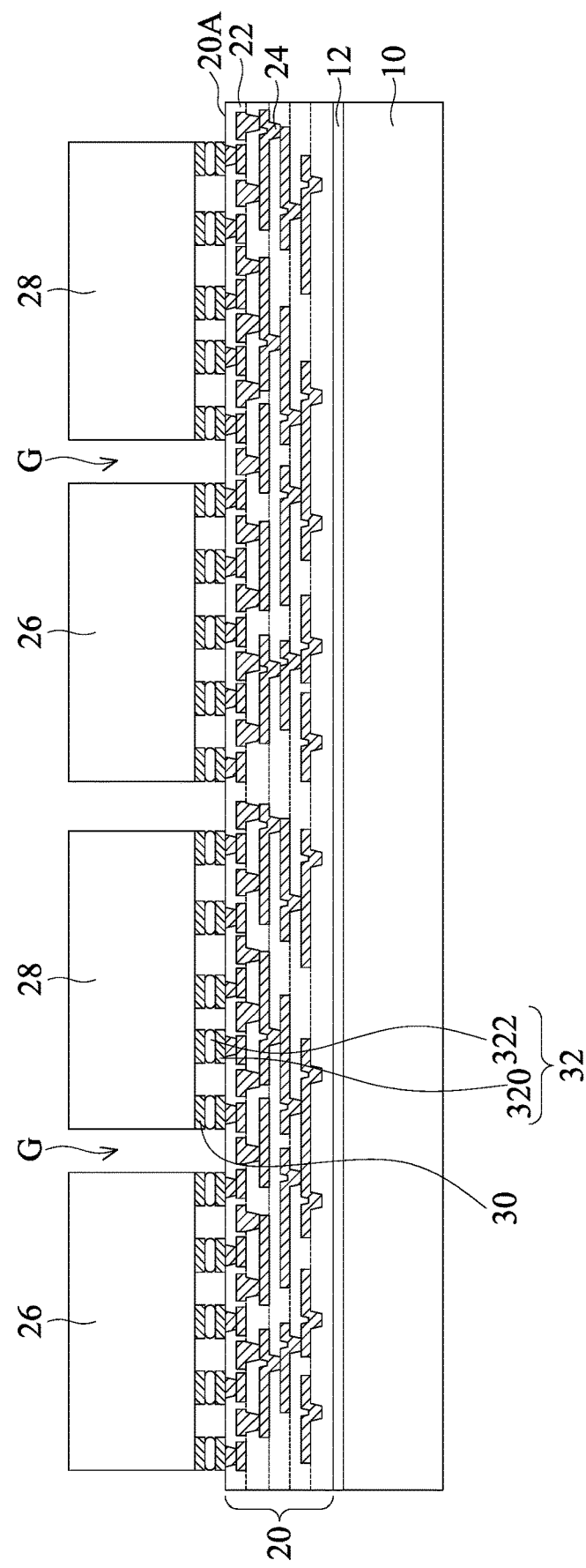

FIG. 1B illustrates the bonding of semiconductor dies 26 and semiconductor dies 28 to the interposer 20 in accordance with some embodiments. Before the bonding process, the semiconductor dies 26 and 28 may be placed over a first side 20A (for example, the upper side shown) of the interposer 20 using, for example, a pick-and-place tool. The semiconductor dies 26 and 28 may be alternately arranged as shown in FIG. 1B, although other arrangements may also be used, depending on design requirements.

In some embodiments, the semiconductor dies 26 and 28 may include one or more logic dies (e.g., central processing unit (CPU) die, graphics processing unit (GPU) die, field-programmable gate array (FPGA) die, application specific integrated circuit (ASIC) die, system-on-chip (SoC) die, system-on-integrated-chip (SoIC) die, microcontroller die, or the like), memory dies (e.g., dynamic random access memory (DRAM) die, static random access memory (SRAM) die, high bandwidth memory (HBM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) die), the like, or a combination thereof. Each of the semiconductor dies 26 and 28 can be obtained, for example, by sawing or dicing a semiconductor wafer (with several IC dies formed thereon) along scribed lines to separate the semiconductor wafer into a plurality of individual semiconductor dies.

In some embodiments, the semiconductor dies 26 (also referred to as first semiconductor dies herein) and the semiconductor dies 28 (also referred to as second semiconductor dies herein) are different types of electronic devices that provide different functions. For example, the first semiconductor dies 26 are processor devices, and the second semiconductor dies 28 are memory devices (which may be a memory die or a memory stack). Other combinations of the semiconductor dies 26 and 28 may also be used. In some other embodiments, a single type of semiconductor dies or more than two different types of semiconductor dies may also be disposed on the interposer 20.

In accordance with some embodiments, after being disposed over the interposer 20, the semiconductor dies 26 and 28 may be bonded to the interposer 20 through flip-chip bonding by way of the conductive elements 30 on each semiconductor die 26/28 and the conductive structures 32 on the interposer 20 to form conductive joints, as shown in FIG. 1B.

In accordance with some embodiments, conductive elements 30, such as conductive pillars, may be formed on the contact pads (not shown) exposed at the active surface (for example, the lower surface shown) of each semiconductor die 26/28 before the bonding process. The conductive elements 30 may be made of or include copper, aluminum, gold, cobalt, titanium, tin, one or more other suitable materials, or a combination thereof, and may be formed using an electroplating process, an electroless plating process, a placement process, a printing process, a physical vapor deposition (PVD) process, a chemical vapor deposition (CVD) process, one or more other applicable processes, or a combination thereof.

In accordance with some embodiments, each of the conductive structures 32 includes a metal pillar 320 and a metal cap layer (such as a solder cap) 322 over the metal pillar 320. The conductive structures 32 including the metal pillars 320 and the metal cap layers 322 are sometimes referred to as micro bumps. The conductive structures 32 may be formed on the contact pads (constructed by some conductive features 24) exposed at the first side 20A of the interposer 20 before the bonding process. The metal pillars 320 may include a conductive material such as copper, aluminum, gold, nickel, palladium, the like, or a combination thereof, and may be formed by sputtering, printing, electroplating, electroless plating, CVD, or the like. The metal pillars 320 may be solder-free and have substantially vertical sidewalls. The metal cap layers 322 may include nickel, tin, tin-lead, gold, copper, silver, palladium, indium, nickel-palladium-gold, nickel-gold, the like, or a combination thereof, and may be formed by a plating process such as an electroplating process.

One of ordinary skill in the art would appreciate that the above conductive structures 32 examples are provided for illustrative purposes, and other structures of the conductive structures 32 may also be used. For example, the metal cap layers 322 are not formed in some other embodiments.

The bonding between the semiconductor dies 26 and 28 and the interposer 20 may be solder bonding or direct metal-to-metal (such as a copper-to-copper) bonding. In accordance with some embodiments, the semiconductor dies 26 and 28 are bonded to the interposer 20 through a reflow process. During the reflow, the conductive joints are in contact with the exposed contact pads of the semiconductor dies 26 and 28 and the exposed contact pads of the interposer 20, respectively, to physically and electrically couple the semiconductor dies 26 and 28 to the interposer 20. The semiconductor dies 26 and 28 can therefore be interconnected through the interposer 20.

Figure 1C:
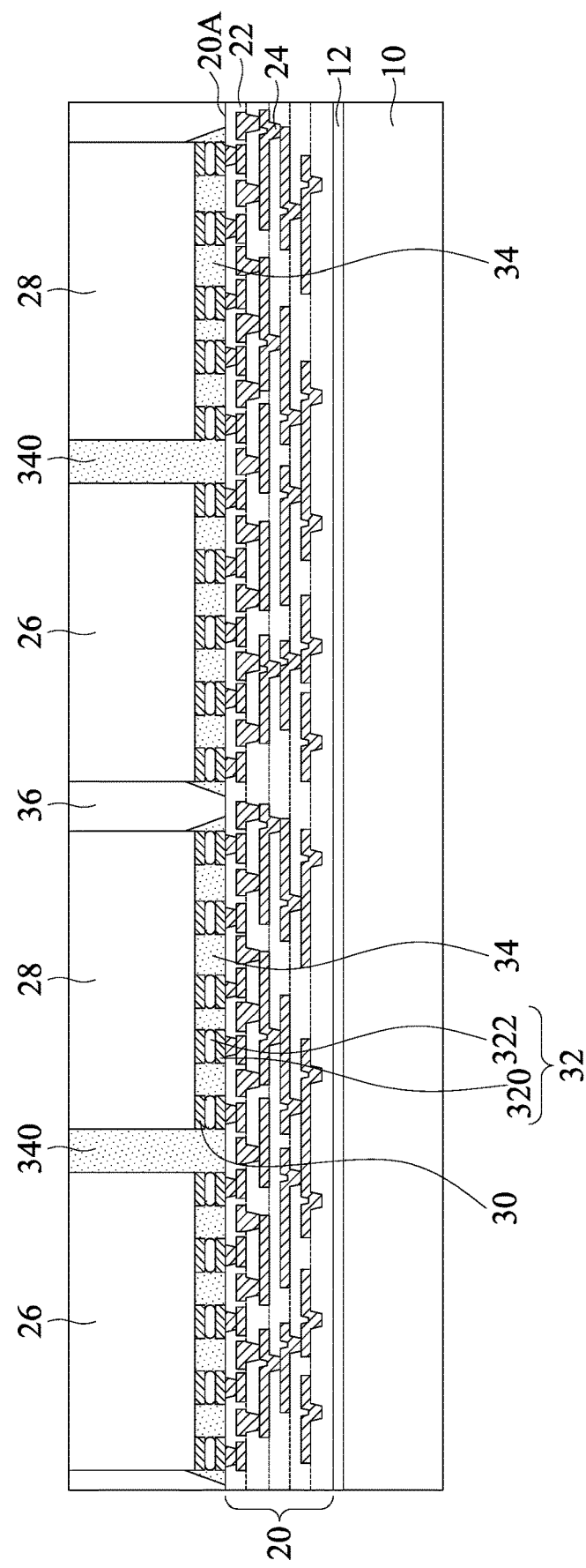

FIG. 1C illustrates the formation of underfill elements 34 over the interposer 20 in accordance with some embodiments. The underfill elements 34 are formed over the first side 20A of the interposer 20 to surround and protect the conductive joints below the semiconductor dies 26 and 28 and enhance the connection between the semiconductor dies 26 and 28 and the interposer 20. In accordance with some embodiments, each of the underfill elements 34 fills the whole gap between the semiconductor dies 26 and 28, the interposer 20 and the conductive joints, and further has a portion 340 extending vertically into a gap G (see FIG. 1B) between adjacent semiconductor dies 26 and 28, as shown in FIG. 1C.

The underfill elements 34 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed along edges of the semiconductor dies 26 and 28 using syringes or needles and drawn into the gaps between each semiconductor die 26/28 and the interposer 20 by capillary effect, to reinforce the strength of the conductive joints and therefore the overall package. After the dispensing, the underfill material is cured to form the underfill elements 34.

FIG. 1C further illustrates the formation of an encapsulant layer 36 over the interposer 20 in accordance with some embodiments. The encapsulant layer 36 is formed over the first side 20A of the interposer 20 to surround and protect the semiconductor dies 26 and 28 and the underfill elements 34. In some other embodiments, the underfill elements 34 are not formed, and the encapsulant layer 36 may further extend into the gap between the semiconductor dies 26 and 28 and the interposer 20 to surround and protect the conductive joints.

In some embodiments, the encapsulant layer 36 is made of or includes an insulating material such as a molding material. The molding material may include a polymer material, such as an epoxy-based resin with fillers dispersed therein. In some embodiments, a molding material (such as a liquid molding material) is dispensed over the interposer 20 such that the semiconductor dies 26 and 28 are buried or covered (i.e., the top surfaces of the semiconductor dies 26 and 28 are covered by the molding material). In some embodiments, a thermal process is then used to cure the liquid molding material and to transform it into the encapsulant layer 36.

In some embodiments, a planarization process (not shown) is further performed on the encapsulant layer 36 to partially remove the encapsulant layer 36, until the top surfaces of semiconductor dies 26 and 28 are exposed through the top surface of the encapsulant layer 36, as shown in FIG. 1C. This facilitates the dissipation of heat generated from the semiconductor dies 26 and 28 during operation. In some other embodiments, after the planarization process, the top surfaces of the semiconductor dies 26 and/or 28 may still be buried in the encapsulant layer 36. The planarization process may include a grinding process, a chemical mechanical polishing (CMP) process, an etching process, a dry polishing process, one or more other applicable processes, or a combination thereof.

Figure 1D:
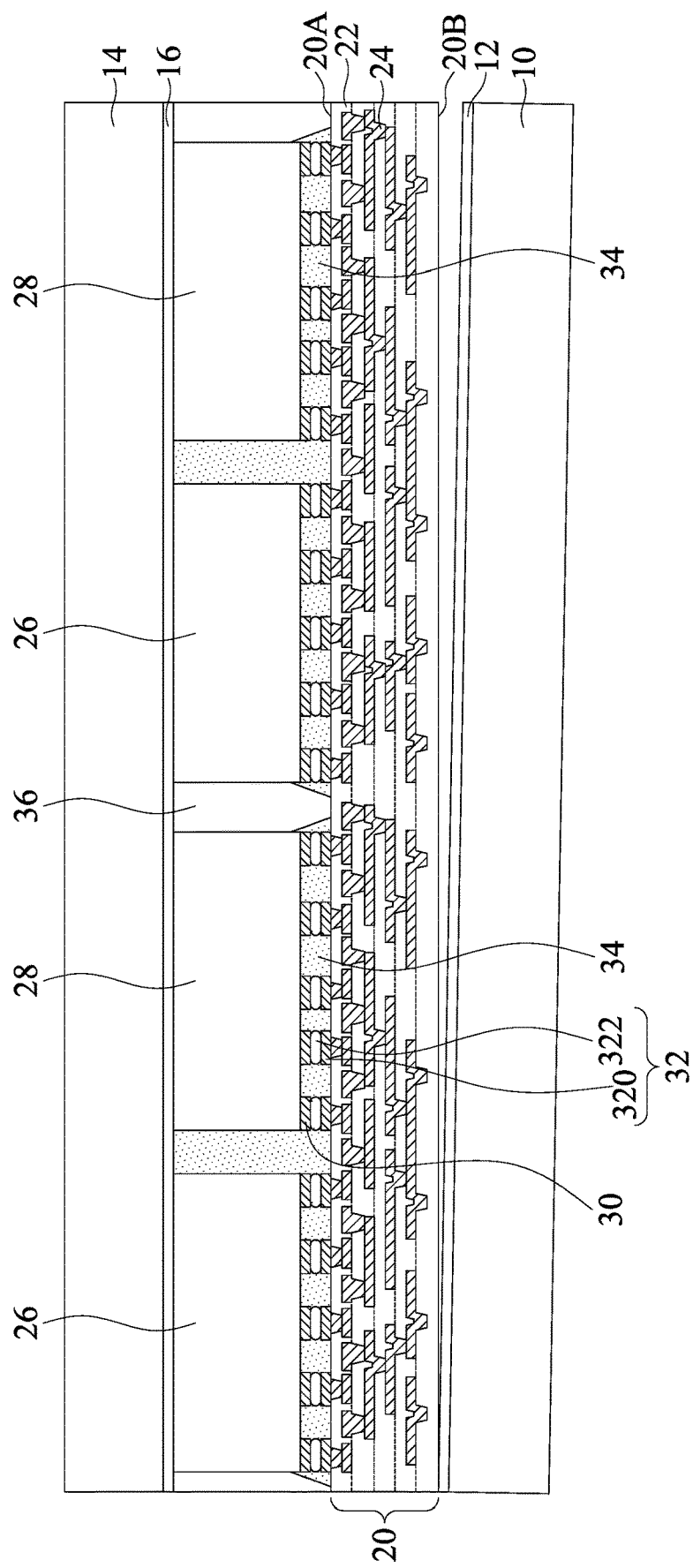

FIG. 1D illustrates the attachment of a second carrier 14 to the resulting structure of FIG. 1C in accordance with some embodiments. The second carrier 14 may be similar to the carrier 10 illustrated in FIG. 1A, and is used to provide temporary mechanical and structural support for the processing of build-up layers or structures during subsequent processing steps. In some embodiments, after the planarization process of the encapsulant layer 36, the second carrier 14 may be attached to the flat top surface of the resulting structure of FIG. 1C (for example, composed of the top surfaces of the encapsulant layer 36 and the semiconductor dies 26 and 28).

In accordance with some embodiments, a second release film 16 may be formed on the resulting structure of FIG. 1C before the attachment of the second carrier 14, as shown in FIG. 1D. The second carrier 14 is then attached to the resulting structure of FIG. 1C through the second release film 16. Similar to the release film 12 illustrated in FIG. 1A, the second release film 16 may be formed of a polymer-based material (such as a Light-To-Heat-Conversion (LTHC) material), which is capable of being decomposed under heat-carrying radiation such as a laser beam, so that the second carrier 14 may be de-bonded from the overlying structures that will be formed in subsequent processes. In the present embodiments, the second release film 16 is formed of an epoxy-based thermal-release material, which is coated onto the flat top surfaces of the encapsulant layer 36 and the semiconductor dies 26 and 28.

FIG. 1D further illustrates the de-bonding of the carrier 10 in accordance with some embodiments. In some embodiments, after attaching the second carrier 14, the carrier 10 may be de-bonded from the remaining structure, for example, by projecting UV light or a laser beam on the release film 12, so that the release film 12 decomposes under the heat of the UV light or the laser beam. Therefore, the remaining structure is separated from the carrier 10. In the resulting structure of FIG. 1D, a second side 20B (opposite to the first side 20A) of the interposer 20 may be exposed. Although not shown, in a subsequent process, the resulting structure of FIG. 1D can be turned upside down to become the state as shown in FIG. 1E.

Figure 1E:
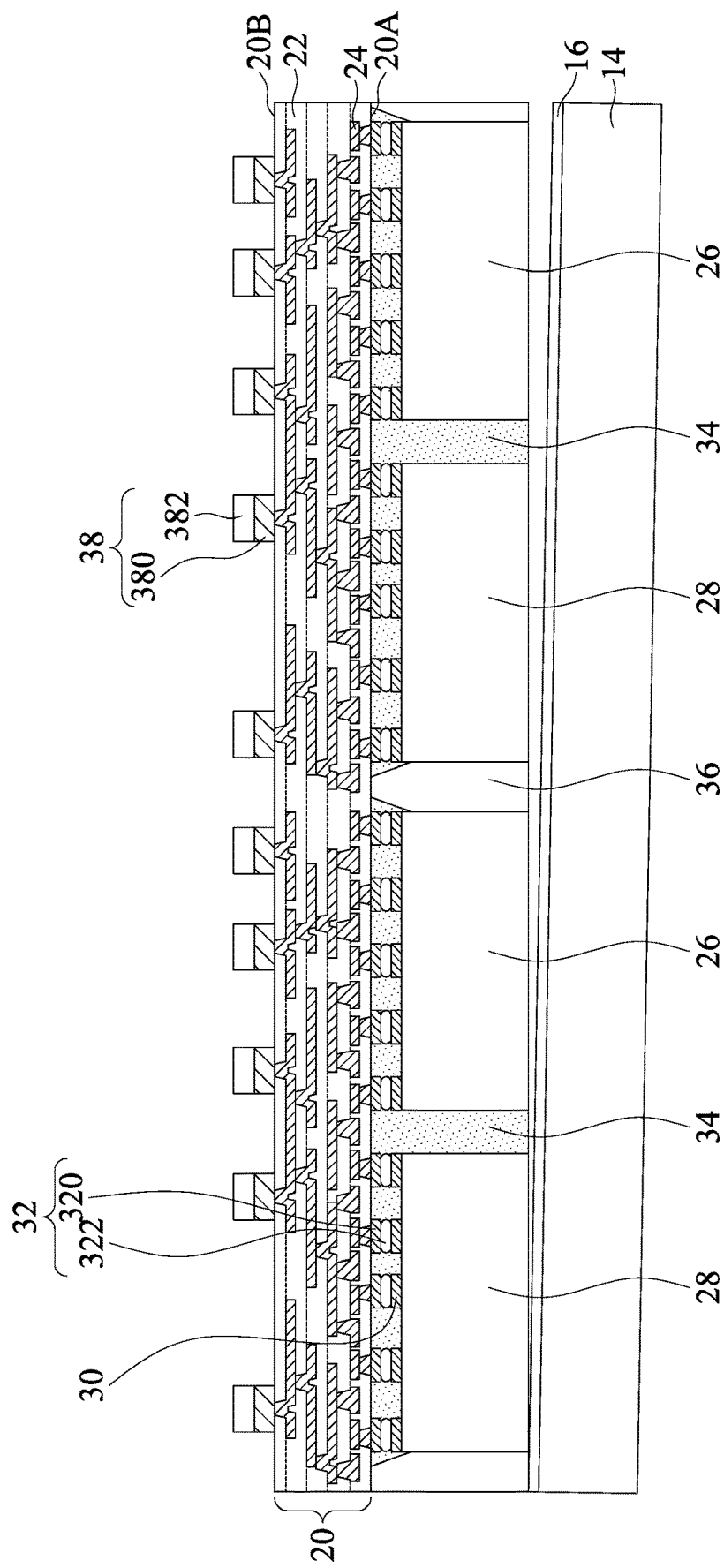

FIG. 1E illustrates the formation of conductive structures 38 over the interposer 20 in accordance with some embodiments. Each of the conductive structures 38 may be electrically connected to one of the contact pads (constructed by some conductive features 24) exposed at the second side 20B of the interposer 20 that is originally covered by the carrier 10. The conductive structures 38 are used to enable electrical connection between the interposer 20 (and the semiconductor dies 26 and 28 thereon) and a package substrate, which will be described later.

In accordance with some embodiments, each of the conductive structures 38 includes a metal pillar 380 and a metal cap layer (such as a solder cap) 382 over the metal pillar 380. The conductive structures 38 including the metal pillars 380 and the metal cap layers 382 are sometimes referred to as controlled collapse chip connection (C4) bumps. The metal pillars 380 may include a conductive material such as copper, aluminum, gold, nickel, palladium, the like, or a combination thereof, and may be formed by sputtering, printing, electroplating, electroless plating, CVD, or the like. The metal pillars 380 may be solder-free and have substantially vertical sidewalls. The metal cap layers 382 may include nickel, tin, tin-lead, gold, copper, silver, palladium, indium, nickel-palladium-gold, nickel-gold, the like, or a combination thereof, and may be formed by a plating process such as an electroplating process.

One of ordinary skill in the art would appreciate that the above conductive structures 38 examples are provided for illustrative purposes, and other structures of the conductive structures 38 may also be used. For example, the metal cap layers 382 are not formed in some other embodiments.

FIG. 1E further illustrates the de-bonding of the second carrier 14 in accordance with some embodiments. In some embodiments, after the formation of the conductive structures 38, the second carrier 14 may be de-bonded from the remaining structure, for example, by projecting UV light or a laser beam on the second release film 16, so that the second release film 16 decomposes under the heat of the UV light or the laser beam. Therefore, the remaining structure is separated from the second carrier 14. In the resulting structure of FIG. 1E, the surfaces of the encapsulant layer 36 and the semiconductor dies 26 and 28 opposite to the interposer 20 may be exposed.

Figure 1F:
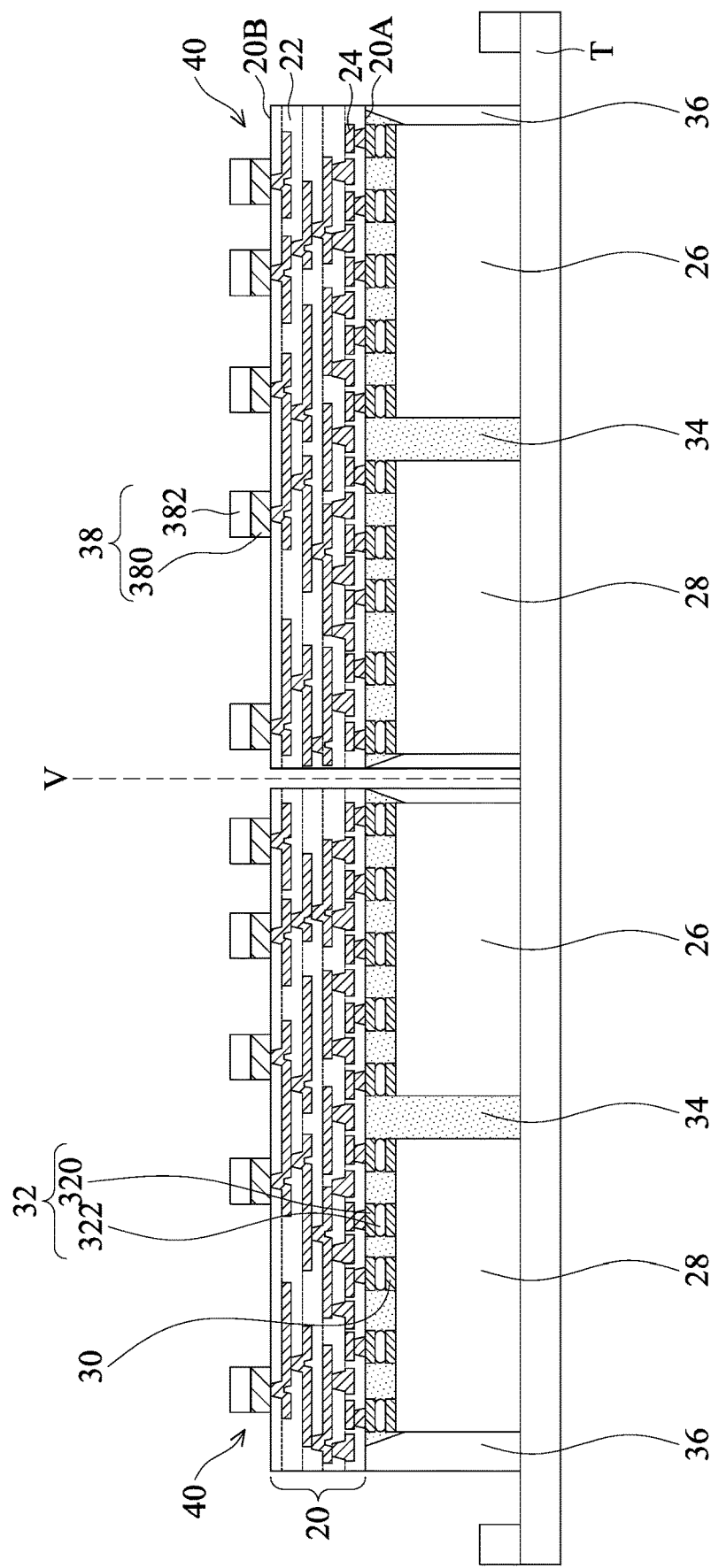

FIG. 1F illustrates a singulation process in accordance with some embodiments. To perform a singulation process, the resulting structure of FIG. 1E may be placed on a frame (not shown) with the exposed surfaces of the encapsulant layer 36 and the semiconductor dies 26 and 28 adhered to a dicing tape T attached to the frame. Afterwards, a singulation process is performed, and the resulting structure of FIG. 1E is sawed along scribe lines V to form a plurality of identical package structures (also referred to as semiconductor devices 40 herein), each including an interposer 20, a first semiconductor die 26 and a second semiconductor die 28 arranged side by side, and other package components mentioned above.

Figure 1G:
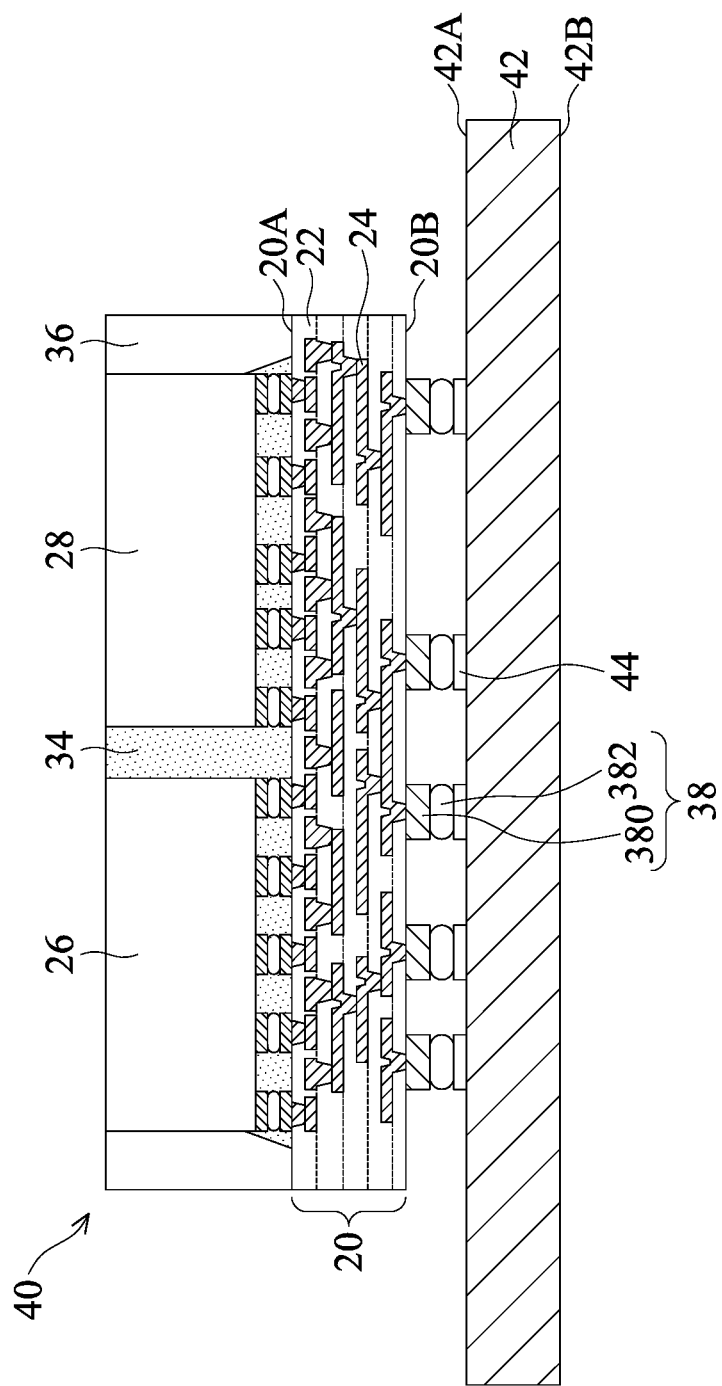
Figure 9:
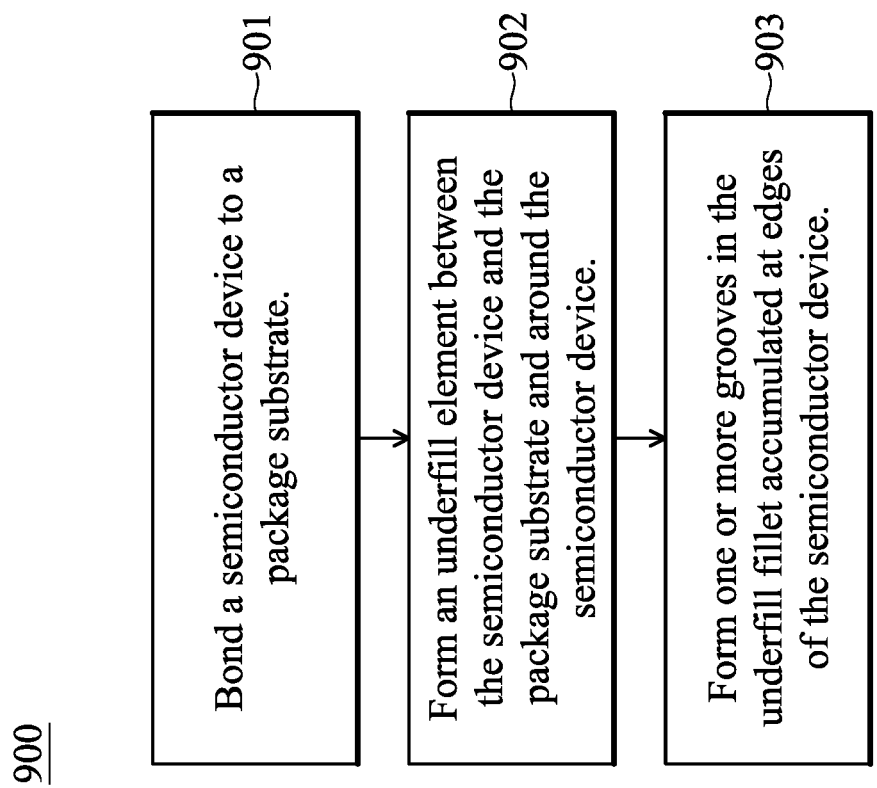
FIG. 9 is a simplified flowchart illustrating a method for forming a semiconductor package in accordance with some embodiments.

FIG. 1G illustrates the bonding of one semiconductor device 40 to a package substrate 42 in accordance with some embodiments. The respective process is illustrated as process 901 in the process flow 900 as shown in FIG. 9. The package substrate 42 is used to provide electrical connection between devices or dies packaged in the package structure and an external electronic device. Although not shown, the package substrate 42 includes conductive lines to interconnect contact pads exposed at a first surface 42A (for example, the upper surface shown) and a second surface 42B (for example, the lower surface shown) of the package substrate 42. The package substrate 42 may include a core or may be a core-less substrate. In some embodiments, the package substrate 42 may be a printed circuit board (PCB), a ceramic substrate, or another suitable package substrate. Several conductive bumps (not shown, such as solder balls) may be formed over the second surface 42B of the package substrate 42 to provide external electrical connection. The processes of forming the conductive bumps are well known in the art and therefore not described herein.

Before the bonding process, the semiconductor device 40 may be placed (by a pick-and-place tool, for example) over the first surface 42A of the package substrate 42 with the conductive structures 38 side faces the first surface 42A. Afterwards, the semiconductor device 40 may be bonded to the package substrate 42 through flip-chip bonding by way of the conductive structures 38 on the semiconductor device 40 and the conductive elements 44 on the package substrate 42 to form conductive joints, as shown in FIG. 1G, in accordance with some embodiments.

In accordance with some embodiments, conductive elements 44, such as conductive pillars, may be formed on the contact pads (not shown) exposed at the first surface 42A of the package substrate 42 before the bonding process. The conductive elements 44 may be made of or include copper, aluminum, gold, cobalt, titanium, tin, one or more other suitable materials, or a combination thereof, and may be formed using an electroplating process, an electroless plating process, a placement process, a printing process, a physical vapor deposition (PVD) process, a chemical vapor deposition (CVD) process, one or more other applicable processes, or a combination thereof.

The bonding between the semiconductor device 40 and the package substrate 42 may be solder bonding or direct metal-to-metal (such as a copper-to-copper) bonding. In accordance with some embodiments, the semiconductor device 40 is bonded to the package substrate 42 through a reflow process. During the reflow, the conductive joints are in contact with the exposed contact pads of the semiconductor device 40 and the exposed contact pads of the package substrate 42, respectively, to physically and electrically couple the semiconductor device 40 to the package substrate 42.

Figure 1H:
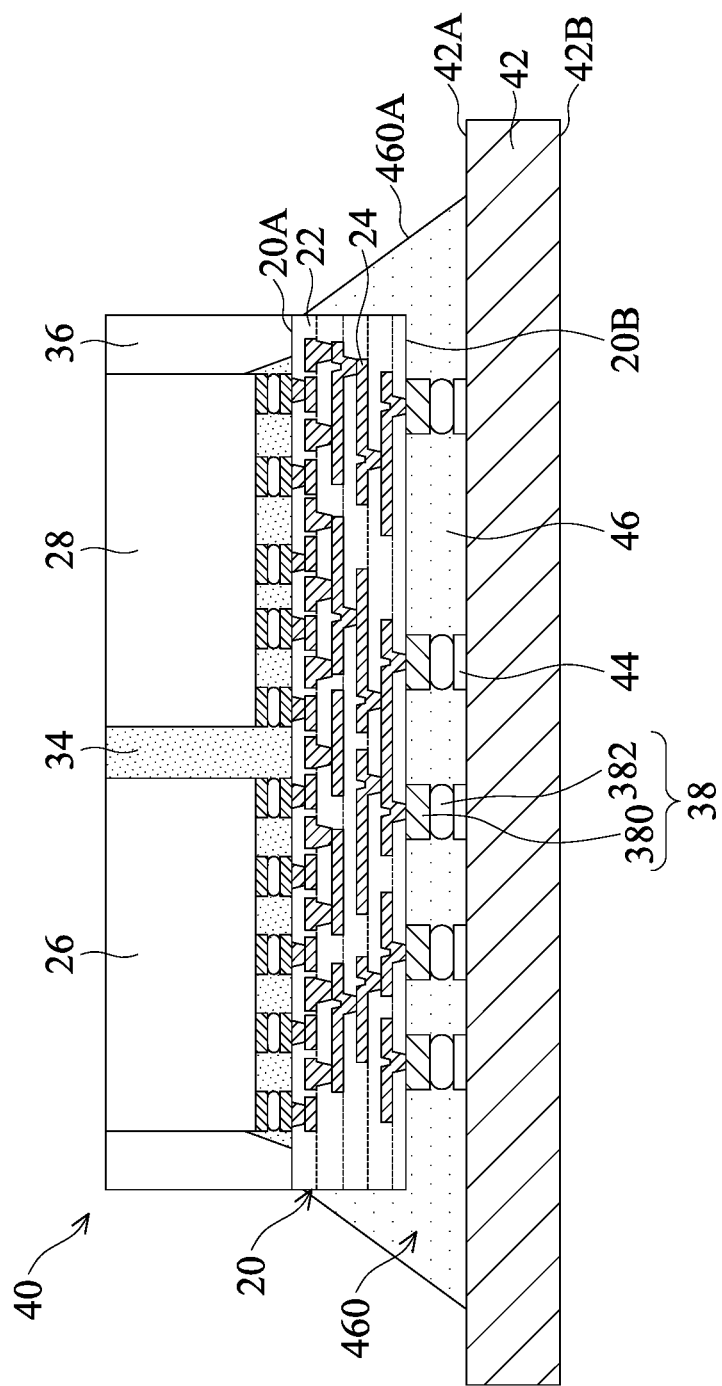

FIG. 1H illustrates the formation of an underfill element 46 over the package substrate 42 in accordance with some embodiments. The respective process is illustrated as process 902 in the process flow 900 as shown in FIG. 9. The underfill element 46 is formed over the first surface 42A of the package substrate 42 to surround and protect the conductive joints below the semiconductor device 40 and enhance the connection between the semiconductor device 40 and the package substrate 42. In accordance with some embodiments, the underfill element 46 fills the whole gap between the semiconductor device 40, the package substrate 42 and the conductive joints. The materials and formation method of the underfill element 46 may be the same as or similar to those of underfill elements 34 illustrated in FIG. 1C, and are not repeated herein.

Figure 2A:
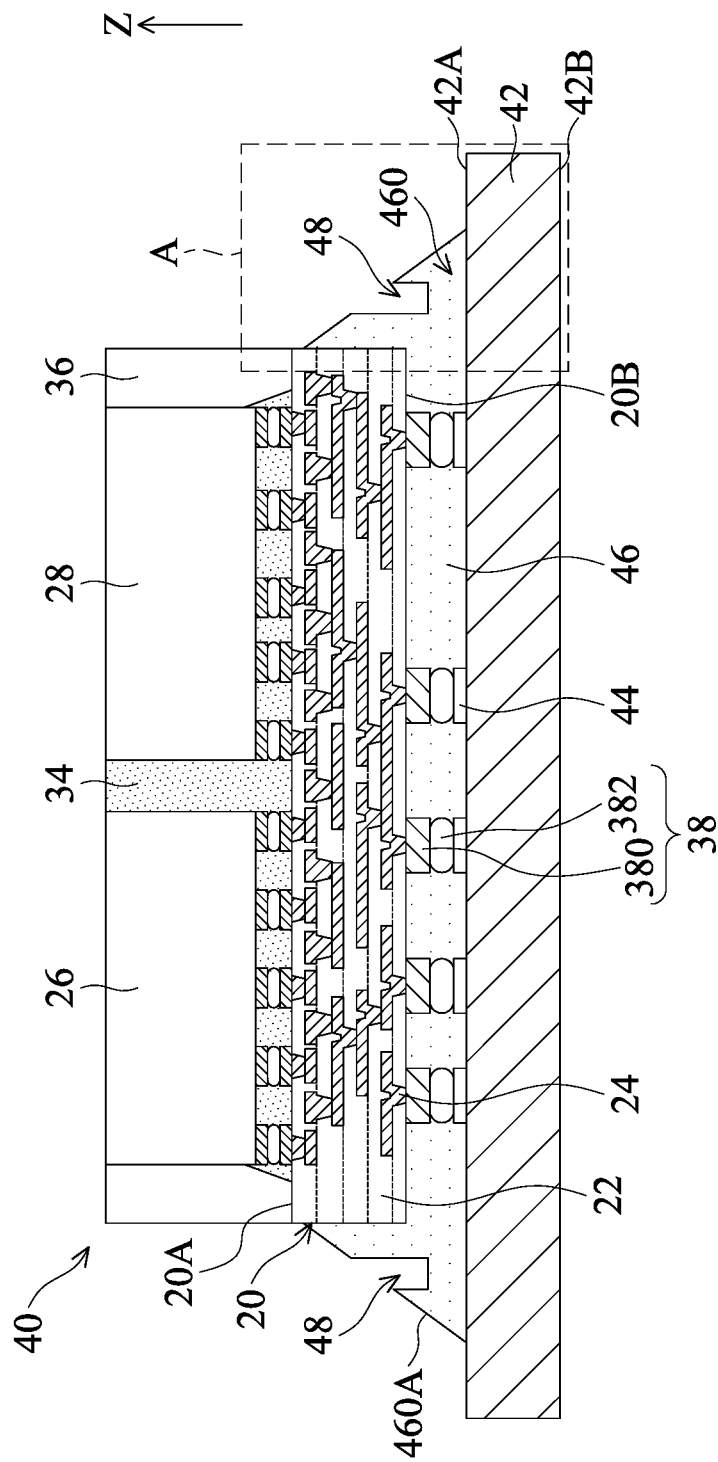
FIG. 2A illustrates a cross-sectional view of a semiconductor package in accordance with some embodiments.
Figure 2B:
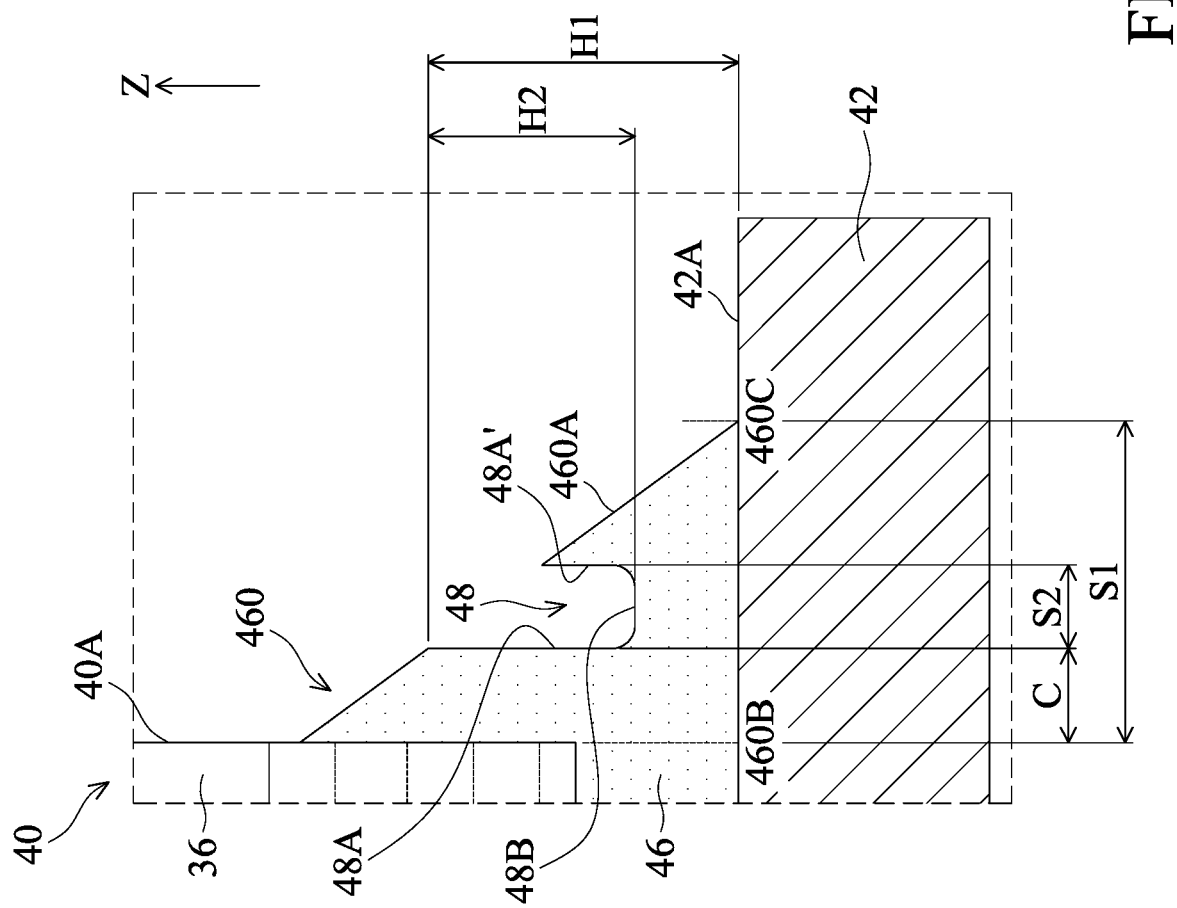
FIG. 2B illustrates an enlarged view of region A in FIG. 2A, showing a groove formed in the fillet portion of the underfill element.
Figure 2C:
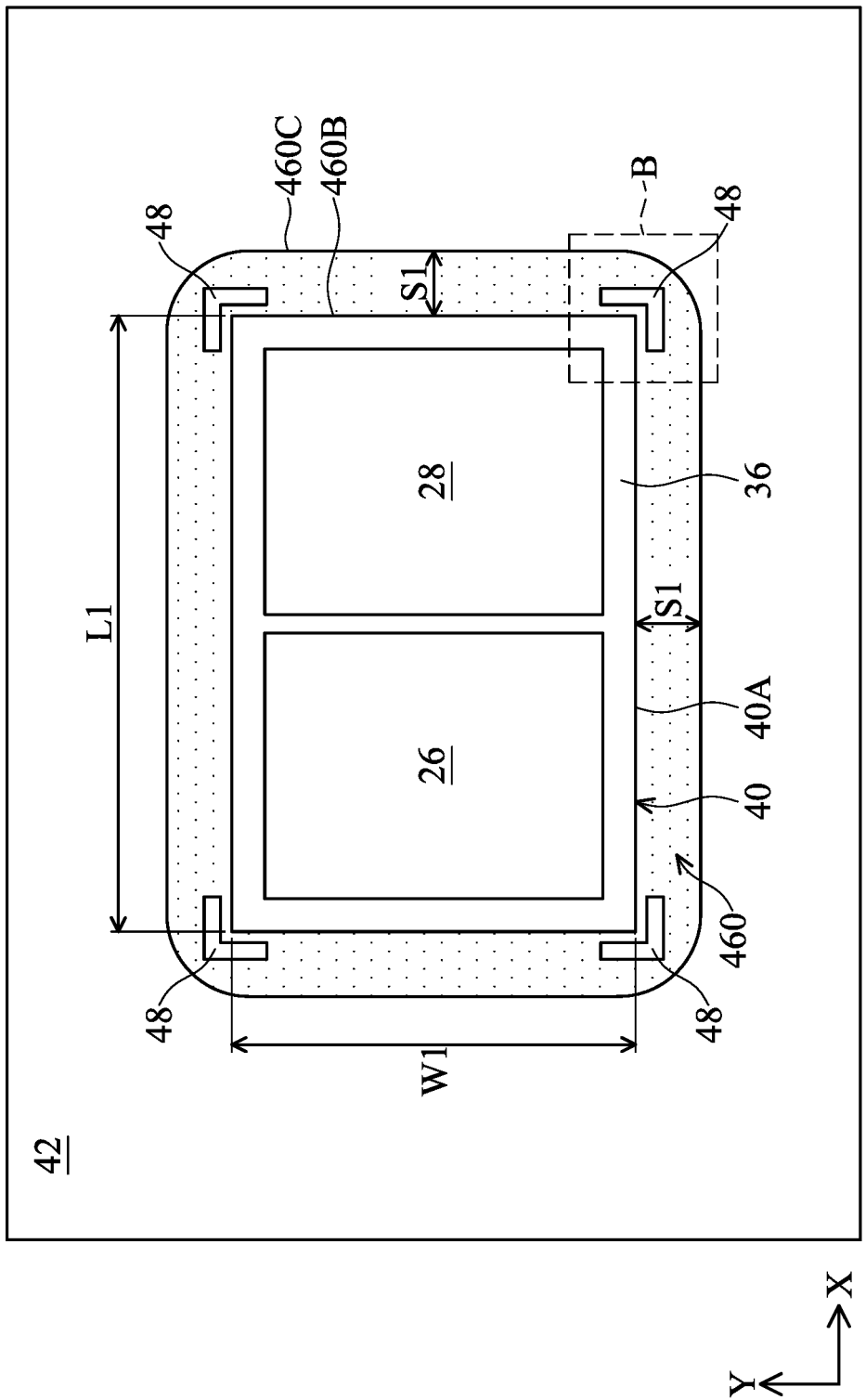
FIG. 2C illustrates a plan view of the semiconductor package in FIG. 2A.

In accordance with some embodiments, the underfill element 46 also includes a fillet portion 460 (sometimes also referred to as an underfill fillet) at each edge of the semiconductor device 40, wherein the fillet portion 460 is formed or accumulated outside of the semiconductor device 40 after the underfill element 46 is cured, as shown in FIG. 1H (see also FIGS. 2B-2C). The fillet portion 460 have an outside surface 460A that slopes up from the first surface 42A of the package substrate 42 to the periphery 40A (i.e., lateral edges) of the semiconductor device 40, thereby sealing the gap between the semiconductor device 40 and the package substrate 42. This provides a moisture barrier and protective layer for the conductive joints below the semiconductor device 40.

In accordance with some embodiments, the fillet portion 460 may have a uniform width S1 along the periphery 40A of the semiconductor device 40, and the width S1 (i.e., the lateral distance between the inner edge 460B of the fillet portion 460 adjacent to the periphery 40A of the semiconductor device 40 and the outer edge 460C of the fillet portion 460 opposite to the inner edge 460B) may be in a range between about 200 μm to about 2000 μm, but the disclosure is not limited thereto.

The above-mentioned various package components and substrate materials that are used in the semiconductor package may have different coefficient of thermal expansions (CTEs). Hence, when the package undergoes thermal cycling during package assembly, reliability testing, or filed operation, the package components and substrate materials may expand at different rates. The different thermal expansion causes physical stress in the package, which increases the risk of damage of the semiconductor device 40 packaged in the package, thereby inducing the reliability issues.

To address the above-mentioned stress issue, the semiconductor package according to some embodiments of the present disclosure further has a stress reduction design, which includes forming one or more grooves in the fillet portion 460 of the underfill element 46.

Figure 1I:
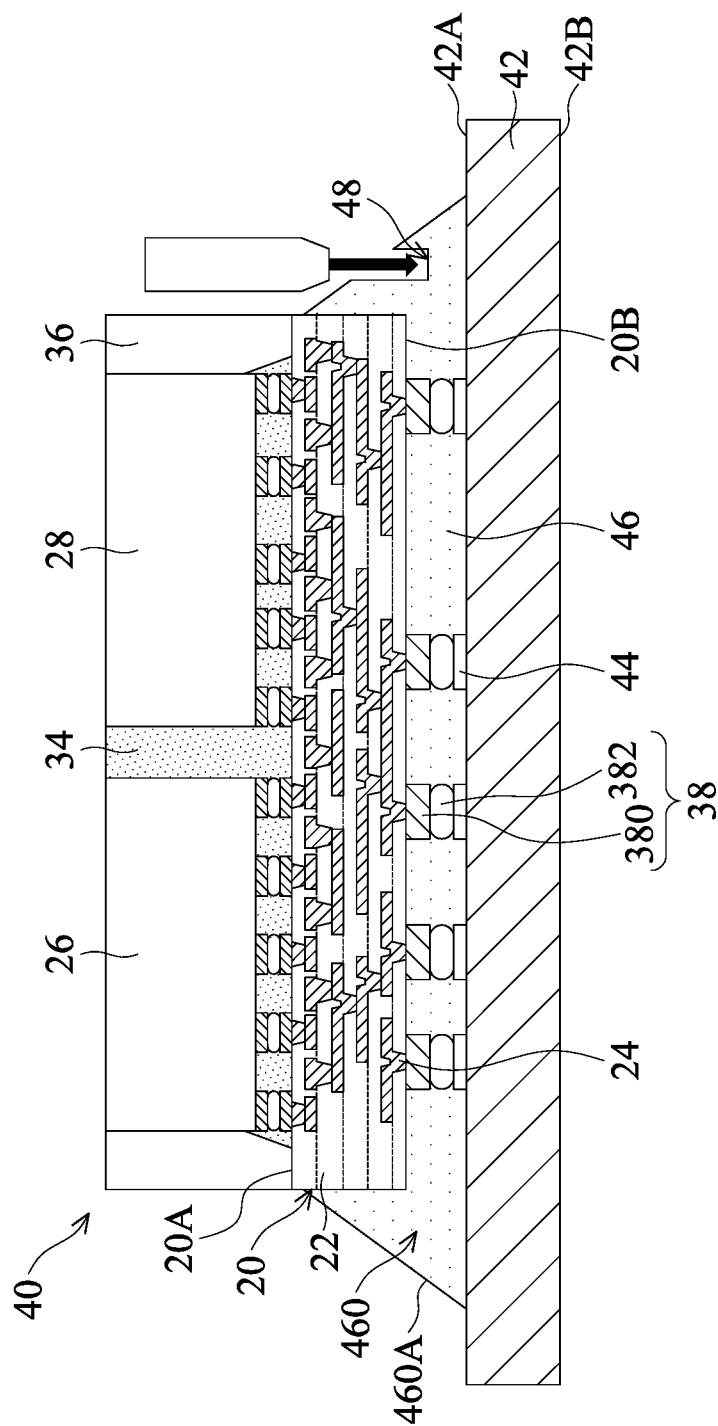

FIG. 1I illustrates the formation of groove(s) 48 in the fillet portion 460 in accordance with some embodiments. The respective process is illustrated as process 903 in the process flow 900 as shown in FIG. 9. In accordance with some embodiments, the groove(s) 48 may be formed by using laser cutting to remove some materials of the fillet portion 460, as shown in FIG. 1I, although other suitable processes may also be used.

By forming or creating groove(s) 48 in the fillet portion 460, the coupling effect of the underfill element 46 between the package substrate 42 and the semiconductor device 40 is reduced. Consequently, the stress generated in the semiconductor device 40 due to the CTE mismatch of the materials used in the semiconductor device 40 and the package substrate 42 can also be reduced or relieved.

Next, the detailed structure and arrangement of the grooves 48 in accordance with some embodiments are described below.

FIG. 2A illustrates a cross-sectional view of a semiconductor package (fabricated by the processes illustrated in FIGS. 1A-1I) in accordance with some embodiments. FIG. 2B illustrates an enlarged view of region A in FIG. 2A. FIG. 2C illustrates a plan (or top) view of the semiconductor package in FIG. 2A. FIG. 2D illustrates an enlarged view of region B in FIG. 2C. In FIGS. 2A-2D, a plurality of grooves 48 are formed in the fillet portion 460 and are separated from each other. The arrangement (for example, locations) of the grooves 48 in the fillet portion 460 will be described later.

In accordance with some embodiments, each of the grooves 48 extends from the outside surface 460A of the fillet portion 460 toward the first surface 42A of the package substrate 42, but does not reach the first surface 42A.

For example, each groove 48 may extend from the outside surface 460A to the inside of the fillet portion 460 in a vertical direction (for example, the Z-direction shown) substantially perpendicular to the first surface 42A, to form a plurality of vertical sidewalls 48A, 48A' and a flat bottom surface 48B connected between the sidewalls 48A and 48A', as shown in FIG. 2B. The bottom surface 48B may be substantially parallel to the first surface 42A. The depth H2 of the groove 48 (i.e., the (vertical) distance between the outside surface 460A and the bottom surface 48B) is smaller than the (vertical) distance H1 between the outside surface 460A and the first surface 42A, so the bottom surface 48B is separated from the first surface 42A. This prevents the laser energy from damaging the package substrate 42. In some cases, the depth H2 of the groove 48 may be in a range between about 30% to about 90% of the distance H1 (for example, the depth H2 may be about 400 µm), although other ranges may also be used.

In accordance with some embodiments, each of the grooves 48 is formed between the inner edge 460B and the outer edge 460C of the fillet portion 460, as shown in FIGS. 2B-2C. In accordance with some embodiments, the width S2 of the groove 48 (i.e., the lateral distance between the sidewall 48A adjacent to the inner edge 460B and the sidewall 48A' adjacent to the outer edge 460C) is smaller than the width S1 of the fillet portion 460. In some cases, the width S2 of the groove 48 may be in a range between about 10% to about 50% of the width S1 of the fillet portion 460 (for example, the width S2 may be about 300 µm), although other ranges may also be used. In accordance with some embodiments, the groove 48 has a uniform width S2 over the entire depth H2, although the groove 48 may have varying widths (for example, two or more widths) in the depth H2 direction in different embodiments. In some embodiments, a depth direction of the groove 48 can be easy adjusted. For example, a depth direction of the groove 48 and the outside surface 460A may have an acute angle, and the sidewall 48A/48A' and the outside surface 460A may have an acute angle. In some embodiments, the outside surface 460A may be or have a curved surface, and/or the groove 48 may has rounded corners between the sidewall 48A/48A' and the bottom surface 48B. In some embodiments, the bottom surface 48B may be a curved surface.

In accordance with some embodiments, each of the grooves 48 is spaced apart from the periphery 40A of the semiconductor device 40. This helps prevent moisture from entering the gap between the semiconductor device 40 and the package substrate 42 through the grooves 48. In some cases, the (lateral) distance C between the periphery 40A of the semiconductor device 40 and the adjacent sidewall 48A of the groove 48 may be in a range between about 10% to about 50% of the width S1 of the fillet portion 460 (for example, the distance C may be about 200 µm), although other ranges may also be used. In accordance with some embodiments, each of the grooves 48 is spaced apart from the inner edge 460B and the outer edge 460C of the fillet portion 460.

In accordance with some embodiments, the grooves 48 in the fillet portion 460 are respectively arranged to correspond to corners (for example, four corners) of the semiconductor device 40 in a plan view, as shown in FIG. 2C. It should be understood that the stress generated during thermal cycling is typically concentrated in the corner regions of the semiconductor device 40, which may cause delamination at the interfaces between the encapsulant layer 36 and the semiconductor dies 26 and 28 (corresponding to the corner regions). Therefore, by arranging the grooves 48 to correspond to and be close to the corners of the semiconductor device 40, it helps to relieve the stress in these corner regions, thereby reducing the risk of delamination of the encapsulant layer 36.

In accordance with some embodiments, each of the grooves 48 has a shape that matches the corresponding corner of the semiconductor device 40 in a plan view. For example, as shown in FIGS. 2C-2D, each groove 48 is L-shaped in the plane view (that is, an L-shaped slot). The L-shaped groove 48 may include a first extension part 481, second extension part 482, and a connection part 483 connected between the first extension part 481 and the second extension part 482.

The first and second extension parts 481 and 482 respectively extend in two orthogonal lateral directions (for example, the X-direction and the Y-direction shown), and are parallel to and laterally overlapping with two adjacent sides of the semiconductor device 40. In some cases, the length L2 (i.e., the length of overlapping area) of the first extension part 481 (in the X-direction) may be in a range between about 0.5% to about 10% of the length L1 of the adjacent side of the semiconductor device 40 (in the X-direction) (for example, the length L2 of the first extension part 481 may be about 500 µm), although other ranges may also be used. Also, the length W2 (i.e., the length of overlapping area) of the second extension part 482 (in the Y-direction) may be in a range between about 0.5% to about 10% of the length W1 of the adjacent side of the semiconductor device 40 (in the Y-direction) (for example, the length W2 of the second extension part 482 may be about 500 m), although other ranges may also be used.

The connection part 483 is arranged close to a corner between two adjacent sides of the semiconductor device 40. In accordance with some embodiments, the connection part 483 is L-shaped in the plane view, with one end adjoining the first extension part 481 and the other end adjoining the second extension part 482. In accordance with some embodiments, the entire groove 48 (including the first extension part 481, the second extension part 482, and the connection part 483) can have a uniform width S2.

Figure 3A:
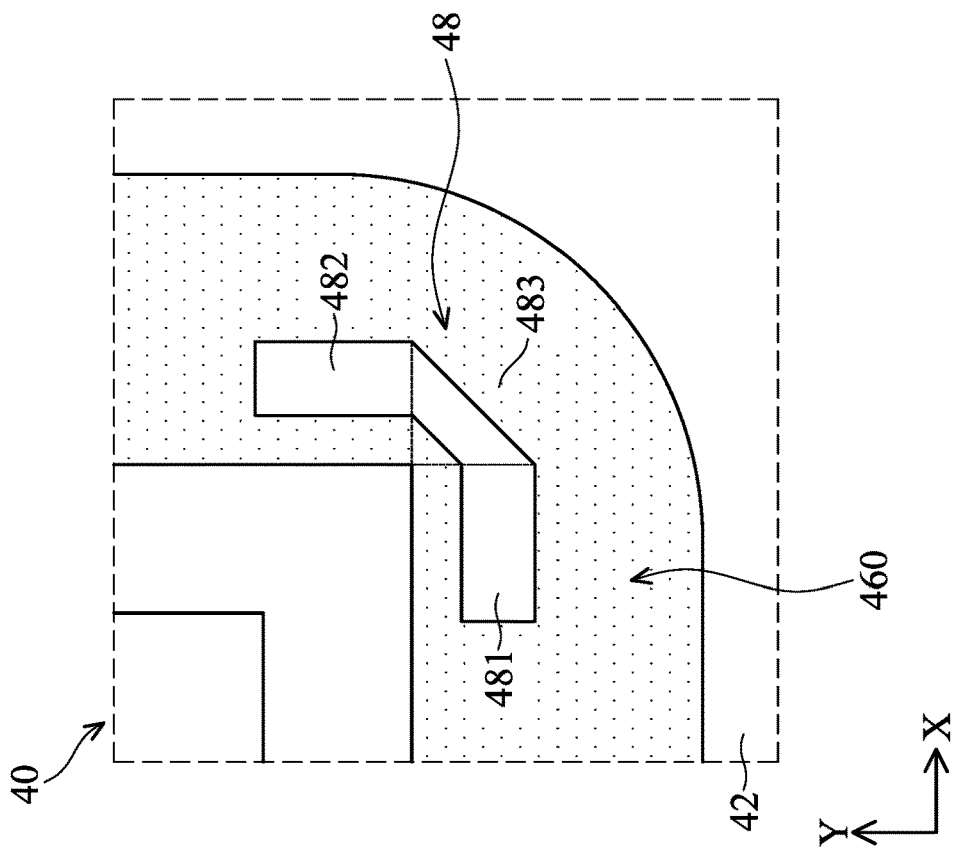
FIGS. 3A and 3B illustrate plan views of grooves of different shapes in accordance with some other embodiments.
Figure 3B:
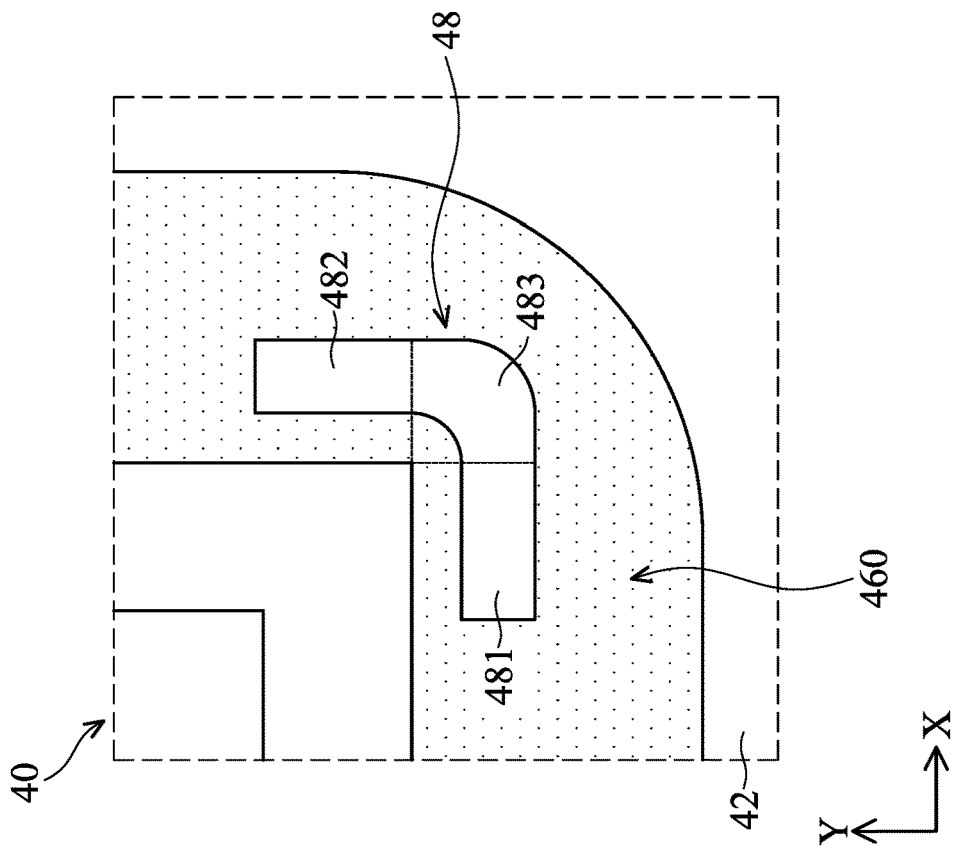

In some alternative embodiments, the plan view shape of the connection part 483 may also be an arc shape (see FIG. 3A), a trapezoidal shape (see FIG. 3B), or any other suitable shape that can be formed by laser cutting.

Many variations and/or modifications can be made to embodiments of the disclosure.

Figure 4:
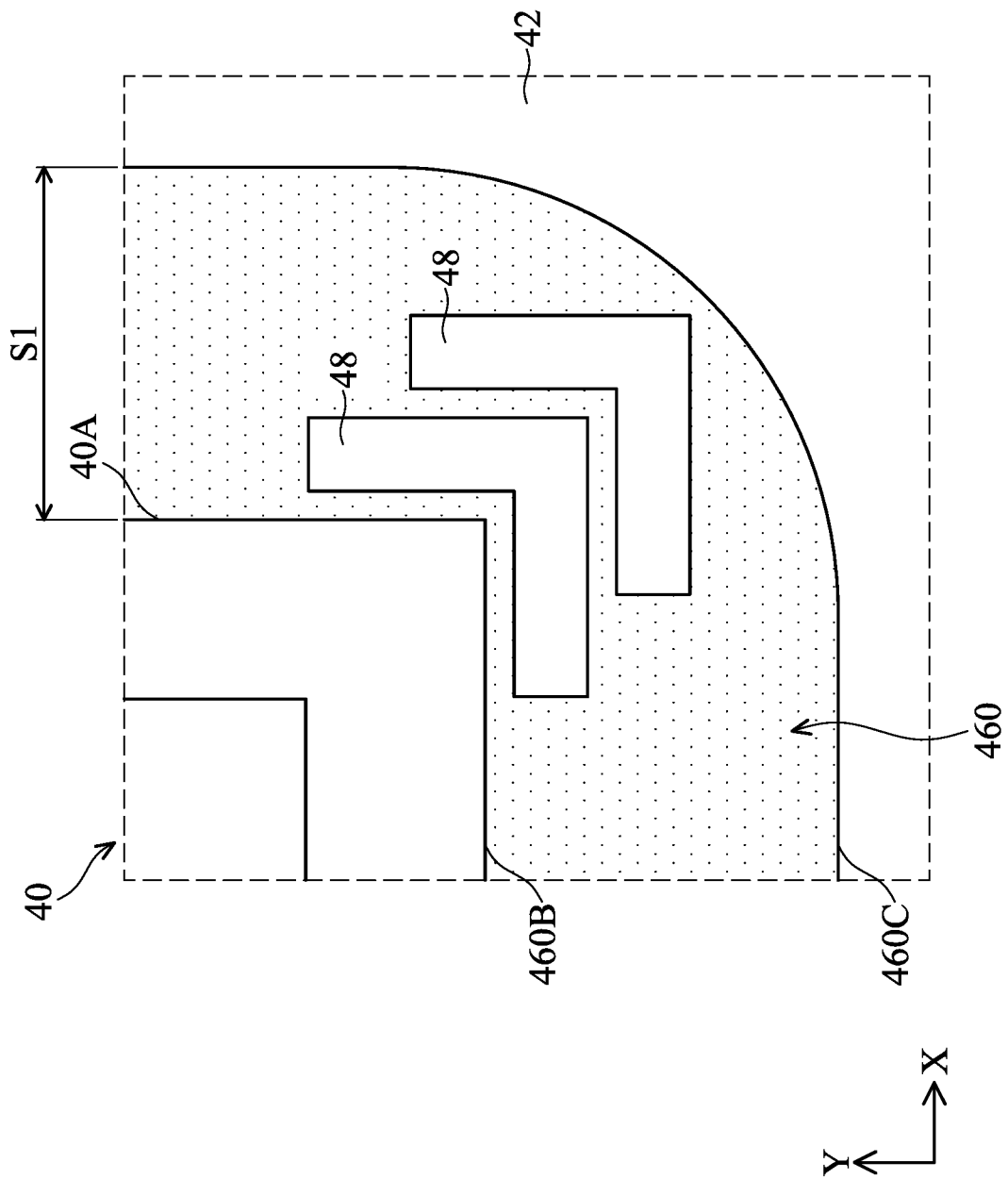
FIG. 4 illustrates the formation of multiple grooves in the width direction of the fillet portion in accordance with some other embodiments.
Figure 5A:
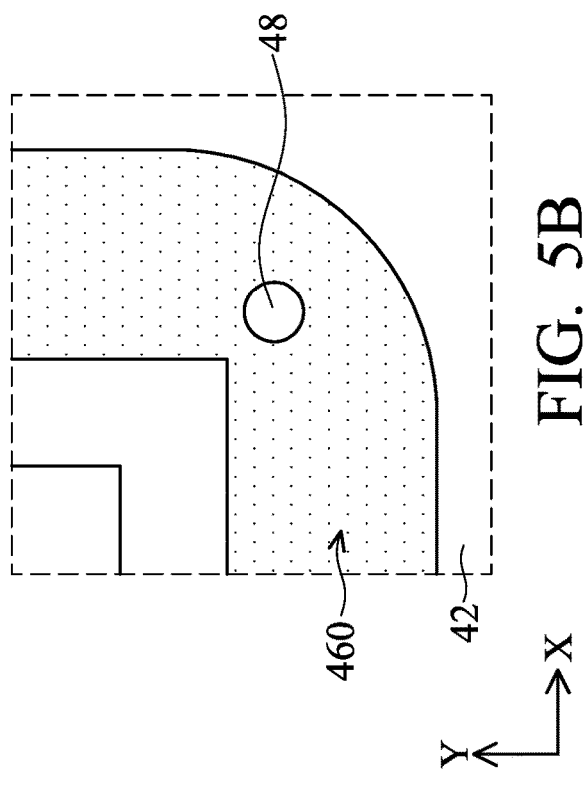
FIGS. 5A, 5B, 5C, and 5D illustrate plan views of grooves of different shapes in accordance with some other embodiments.
Figure 5B:
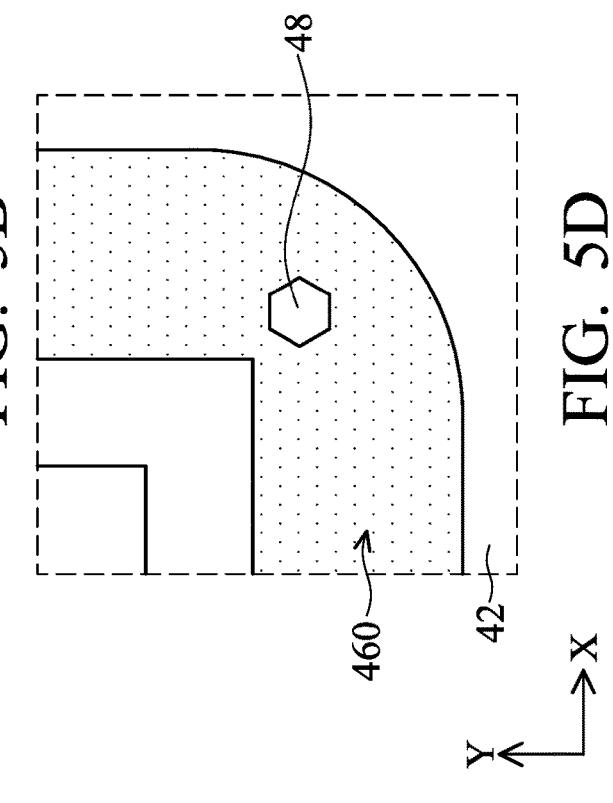
Figure 5C:
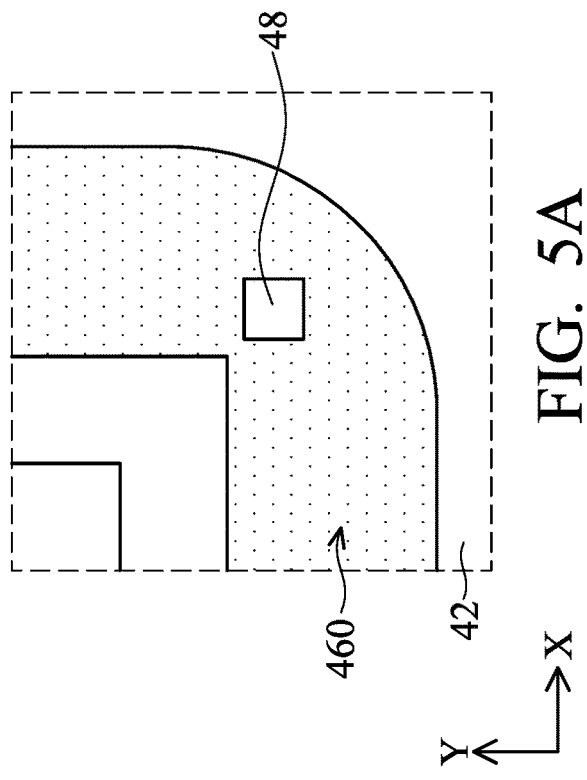
Figure 5D:
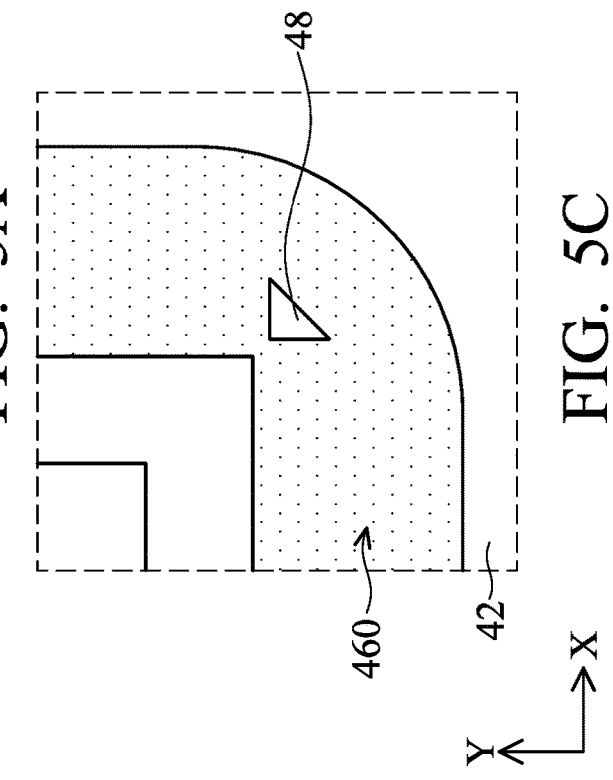

For example, in accordance with some other embodiments, a plurality of (e.g., two) grooves 48 (multiple rows of grooves 48) may be arranged or provided in the width S1 direction of the fillet portion 460 perpendicular to the periphery 40A of the semiconductor device 40, as shown in FIG. 4. The multiple rows of grooves 48 may be spaced apart from the inner edge 460B and the outer edge 460C of the fillet portion 460. The increase in the number of grooves 48 in the width S1 direction helps to further reduce stress in the package.

In accordance with some other embodiments, the grooves 48 in the fillet portion 460 may have a plan view shape different from the L-shape (as discussed above), including, for example, a rectangle, a circle, a triangle, a hexagon as shown in FIGS. 5A-5D, or any other suitable shape, as long as they can reduce the coupling effect of the underfill element 46. For example, the grooves 48 arranged in concentric circles are provided in the fillet portion 460 at each corner of the semiconductor device 40, in some cases.

Figure 6A:
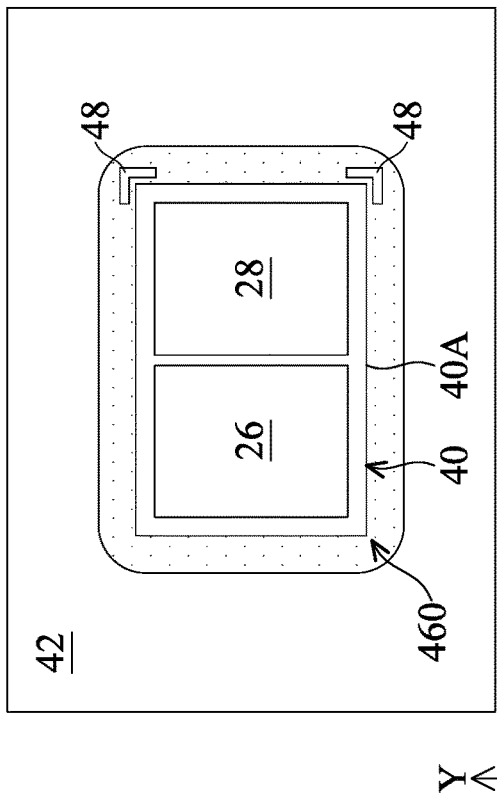
FIGS. 6A, 6B, 6C, and 6D illustrate plan views of different arrangements of groove(s) in the fillet portion in accordance with some other embodiments.
Figure 6B:
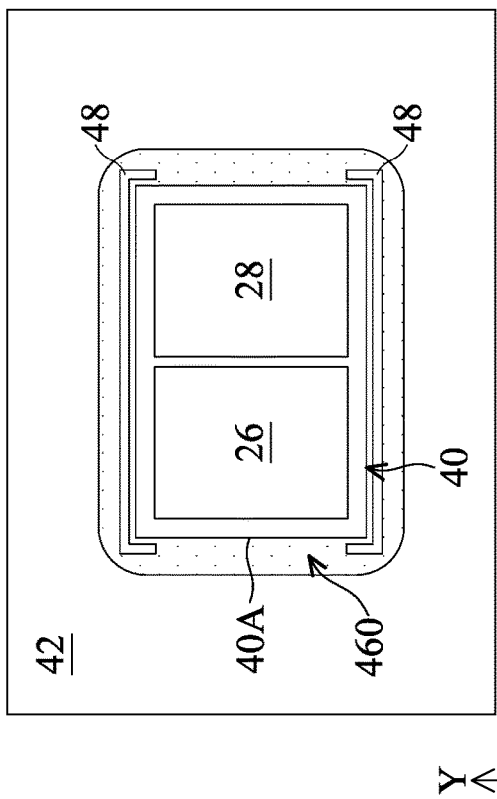
Figure 6C:
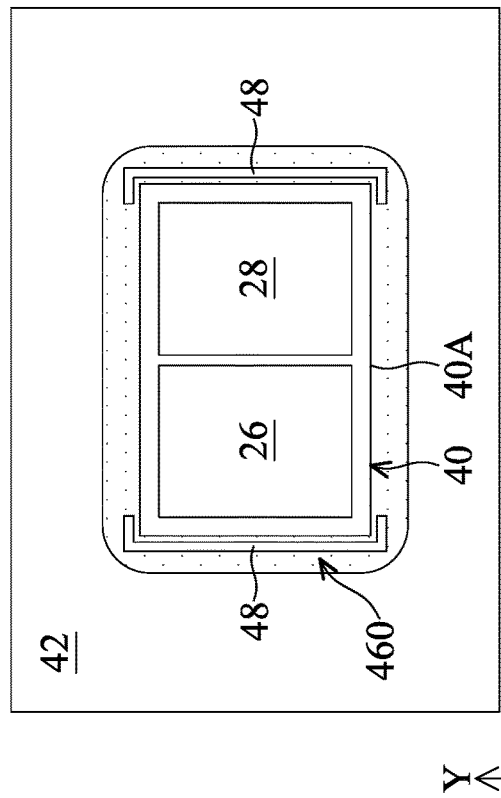
Figure 6D:
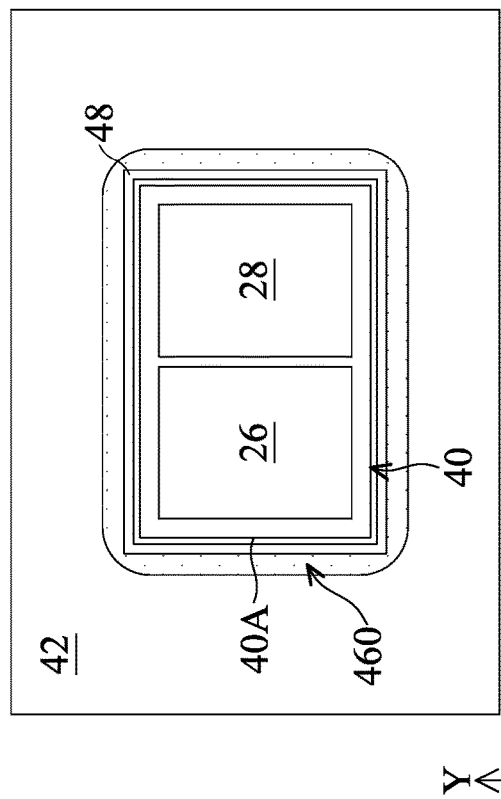

Different numbers and/or arrangements of the grooves 48 may also be used in different embodiments. For example, FIGS. 6A, 6B, 6C, and 6D illustrate plan views of different arrangements of groove(s) 48 in the fillet portion 460 in accordance with some other embodiments. In FIG. 6A, the grooves 48 may be arranged to correspond to only two corners of the semiconductor device 40, so as to reduce the stress in these corner areas. In some other embodiments, the groove(s) 48 may also be arranged to correspond to only one corner or some corners of the semiconductor device 40, depending on the actual needs. In FIGS. 6B-6C, the grooves 48 are arranged not only close to the four corners of the semiconductor devices 40, but also along opposite sides (in the X-direction or in the Y-direction) of the semiconductor devices 40. More specifically, each of the grooves 48 is elongated and extends continuously from one corner to the other corner along one side (in the X-direction or in the Y-direction) of the semiconductor devices 40. In FIG. 6D, only a single groove 48 is provided, but is not limited thereto. The groove 48 is elongated and extends continuously along the entire periphery 40A (i.e., along all corners and sides) of the semiconductor device 40.

Figure 7:
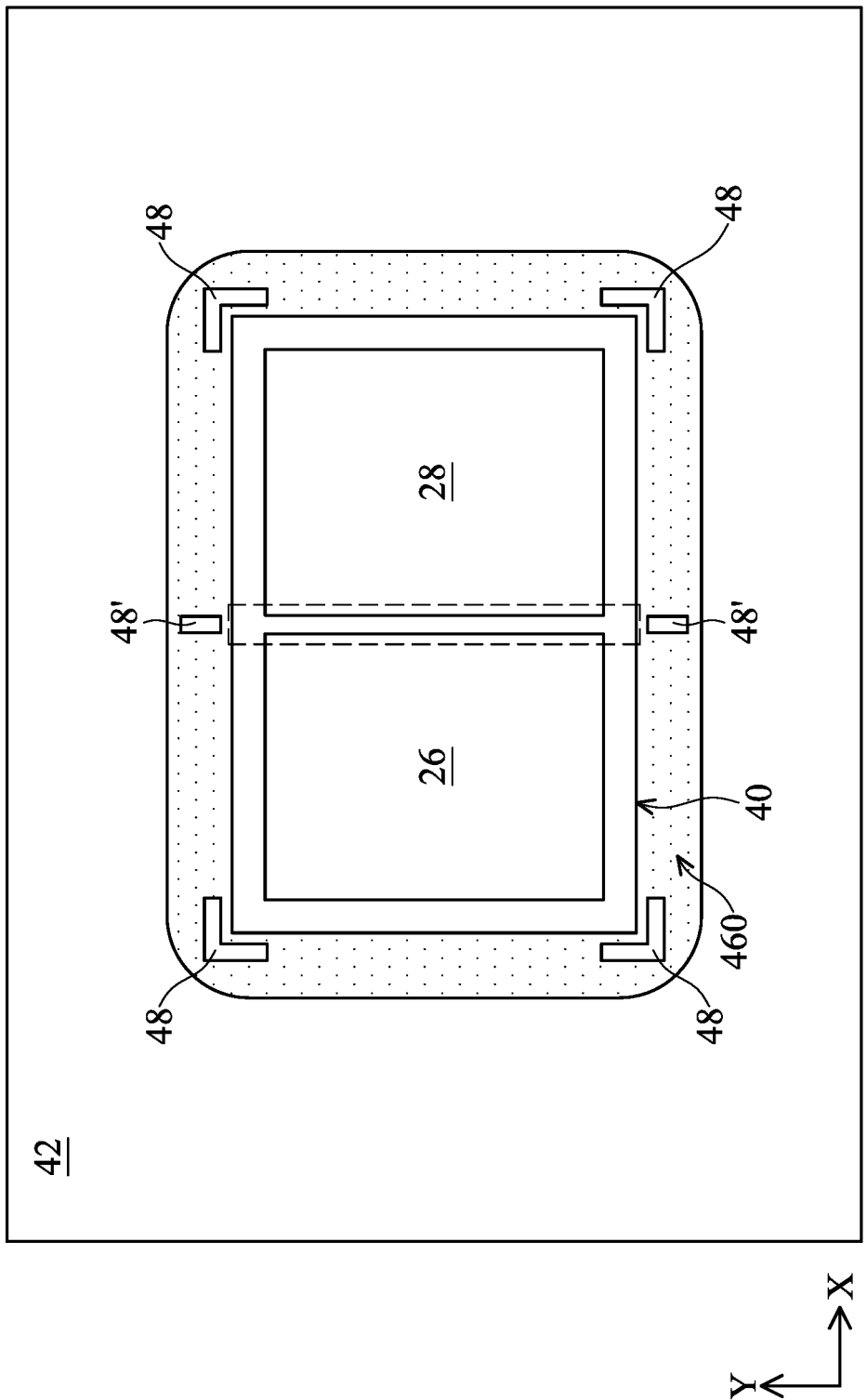
FIG. 7 illustrates the formation of additional grooves corresponding to the die-to-die region in accordance with some other embodiments.

In accordance with some other embodiments, there are additional grooves 48' provided in the fillet portion 460 to correspond to the gap G (see FIG. 1B) between adjacent semiconductor dies 26 and 28 in a plan view, as shown in FIG. 7. It should be understood that the stress generated during thermal cycling is also easily concentrated in the die-to-die region (as indicated by the dotted box in FIG. 7) of the semiconductor device 40 in some cases, which may cause delamination at the interfaces between the underfill portion 340 (see FIG. 1C) and the semiconductor dies 26 and 28 (corresponding to the die-to-die region). Therefore, by arranging the grooves 48' to correspond to and be close to the gap G between adjacent semiconductor dies 26 and 28 (i.e., the die-to-die region of the semiconductor device 40), it helps to relieve the stress in the die-to-die region, thereby reducing the risk of delamination of the underfill element 34.

In some other embodiments, the grooves 48 corresponding to the corner regions of the semiconductor device 40 can be omitted, and the grooves 48' remains in the fillet portion 460.

Figure 8:
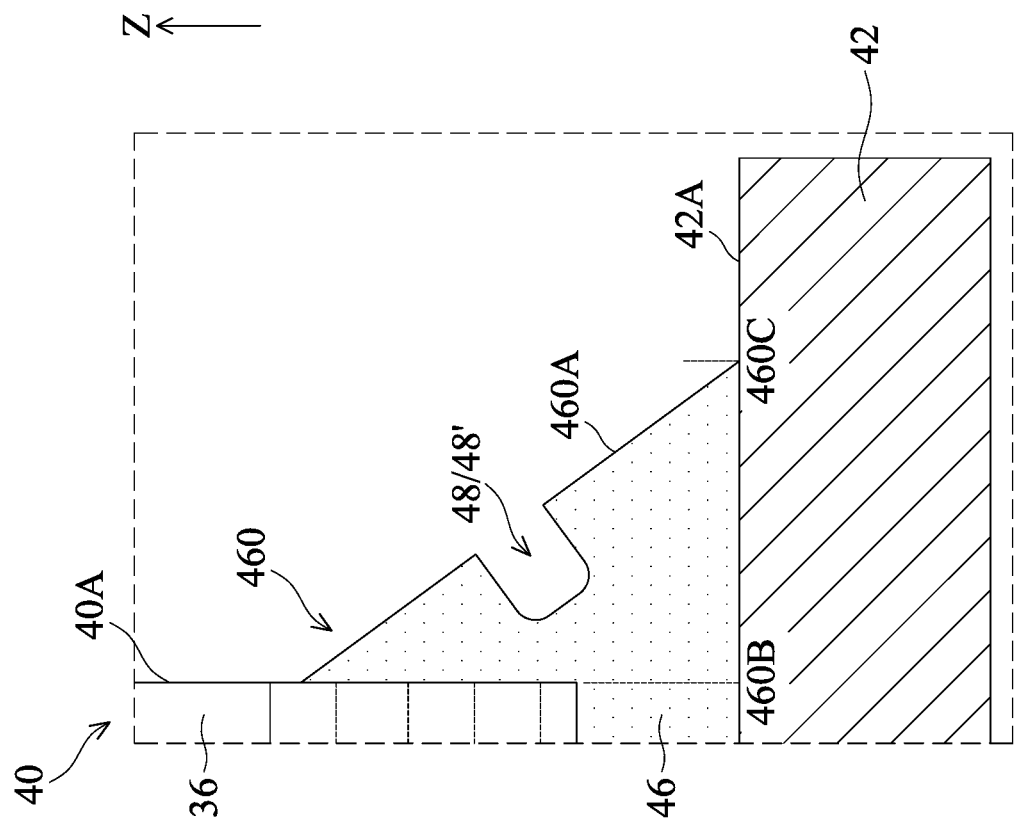
FIG. 8 illustrates that the groove extends in an oblique direction with respect to the surface of the package substrate, in accordance with some other embodiments.

Although the above-mentioned embodiments of grooves 48 or 48' extend in a (vertical) direction substantially perpendicular to the first surface 42A of the package substrate 42, the disclosure is not limited thereto. In accordance with some other embodiments, the grooves 48 or 48' may also be formed (by laser cutting, for example) to extend in an oblique direction with respect to the first surface 42A of the package substrate 42 as shown in FIG. 8, as long as they are still apart from the first surface 42A and the periphery 40A of the semiconductor device 40.

In some alternative embodiments, the oblique groove can also be applied to the embodiments shown in FIG. 4. For example, one of the two grooves 48 in the width S1 direction of the fillet portion 460 is vertical, and the other is inclined. In some cases, the inner groove 48 (i.e., the inner row groove) is vertical and has a larger depth, and the outer groove 48 (i.e., the outer row groove) is inclined and has a smaller depth. The width of the outer groove 48 may be greater than the width of the inner groove 48. In some other embodiments, the inner groove 48 can be changed from a L-shaped groove to the groove shapes shown in FIGS. 5A-5D, and the outer groove 48 is a L-shaped groove, which is vertical or inclined. The inner groove 48 and the outer groove 48 may have different depths and/or widths.

In some further embodiments, the number of grooves 48 in the width S1 direction of the fillet portion 460 may be three or more, and the grooves 48 may have any combination of the above-mentioned shape, size (widths and/or depths), and/or angle (vertical or inclined). For example, in cases where three grooves are provided in the width S1 direction of the fillet portion 460, the middle groove may have a different shape, size, and/or angle from other grooves.

It should be understood that the geometries, configurations and the manufacturing methods described herein are only illustrative, and are not intended to be, and should not be constructed to be, limiting to the present disclosure. Many alternatives and modifications will be apparent to those skilled in the art, once informed by the present disclosure.

It is also appreciated that although in the example embodiments described above, a package module (including semiconductor dies packaged on an interposer) is described as an example of the semiconductor device 40, the semiconductor device 40 may also be of other types (for example, a single semiconductor chip or die). The formation of the above-mentioned grooves in the underfill fillet also helps to reduce the stress on a single semiconductor chip/die packaged on the package substrate, thereby reducing the risk of damage (for example, cracking) of the semiconductor chip/die.

The embodiments of the present disclosure have some advantageous features. By providing or forming one or more grooves in the underfill fillet to correspond to the high stress regions of the packaged semiconductor device, it eliminates the risk of semiconductor device damage (for example, cracking or delamination) during thermal cycling. As a result, the reliability of the entire package is improved.

In accordance with some embodiments, a semiconductor package is provided. The semiconductor package includes a package substrate, a semiconductor device, an underfill element, and a groove. The semiconductor device is bonded to the surface of the package substrate through multiple electrical connectors. The underfill element is formed between the semiconductor device and the surface of the package substrate and configured to surround and protect the electrical connectors. The underfill element includes a fillet portion that extends laterally beyond the periphery of the semiconductor device and is formed along the periphery of the semiconductor device. The groove is formed in the fillet portion and spaced apart from the periphery of the semiconductor device.

In accordance with some embodiments, a semiconductor package is provided. The semiconductor package includes a package substrate, a semiconductor device, an underfill element, and multiple grooves. The semiconductor device is disposed over the surface of the package substrate. The underfill element is formed between the semiconductor device and the surface of the package substrate. The underfill element includes a fillet portion that extends laterally beyond the periphery of the semiconductor device and is formed along the periphery of the semiconductor device. The grooves are formed in the fillet portion and separated from each other. Also, the grooves are arranged to correspond to parts of the semiconductor device, respectively.

In accordance with some embodiments, a method for forming a semiconductor package is provided. The method includes mounting a semiconductor device on the surface of a package substrate. The method also includes forming an underfill element between the semiconductor device and the surface of the package substrate. The underfill element includes a fillet portion that extends laterally beyond the periphery of the semiconductor device and is formed along the periphery of the semiconductor device. In addition, the method includes forming one or more grooves in the fillet portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a package substrate;
   a semiconductor device bonded to a surface of the package substrate through a plurality of electrical connectors;
   an underfill element formed between the semiconductor device and the surface of the package substrate, configured to surround and protect the electrical connectors, wherein the underfill element comprises a fillet portion that extends laterally beyond a periphery of the semiconductor device and is formed along the periphery of the semiconductor device; and
   a groove formed in the fillet portion and spaced apart from the periphery of the semiconductor device.

2. The semiconductor package as claimed in claim 1, wherein the fillet portion has an inner edge adjacent to the periphery of the semiconductor device and an outer edge opposite to the inner edge, and
   wherein the groove is formed between the inner edge and the outer edge of the fillet portion, and a width of the groove is smaller than a width of the fillet portion.

3. The semiconductor package as claimed in claim 1, wherein the fillet portion has an outside surface that slopes up from the surface of the package substrate to the periphery of the semiconductor device, and
   wherein the groove extends from the outside surface of the fillet portion toward the surface of the package substrate, but does not reach the surface of the package substrate.

4. The semiconductor package as claimed in claim 3, wherein the groove extends in a direction perpendicular to or inclined relative to the surface of the package substrate.

5. The semiconductor package as claimed in claim 1, wherein the semiconductor device comprises a plurality of sides and a plurality of corners, and
   wherein the groove is arranged close to one corner of the plurality of corners in a plan view.

6. The semiconductor package as claimed in claim 5, wherein the groove comprises a first extension part and a second extension part respectively parallel to two adjacent sides of the plurality of sides, and a connection part formed between the first extension part and the second extension part and corresponding to the corner between the two adjacent sides.

7. The semiconductor package as claimed in claim 6, wherein in the plan view, the connection part is L-shaped, arc-shaped, or trapezoidal.

8. The semiconductor package as claimed in claim 1, wherein the semiconductor device comprises a plurality of sides and a plurality of corners, and
   wherein the groove is elongated, and is continuously arranged along two corners of the plurality of corners and one side of the plurality of sides between the two corners in a plan view.

9. The semiconductor package as claimed in claim 1, wherein the groove is elongated, and is continuously arranged along the entire periphery of the semiconductor device in a plan view.

10. The semiconductor package as claimed in claim 1, further comprising a plurality of grooves arranged in a width direction of the fillet portion perpendicular to the periphery of the semiconductor device.

11. A semiconductor package, comprising:
    a package substrate;
    a semiconductor device disposed over a surface of the package substrate;
    an underfill element formed between the semiconductor device and the surface of the package substrate, wherein the underfill element comprises a fillet portion that extends laterally beyond a periphery of the semiconductor device and is formed along the periphery of the semiconductor device; and
    a plurality of grooves formed in the fillet portion and separated from each other, wherein the plurality of grooves are arranged to correspond to parts of the semiconductor device, respectively.

12. The semiconductor package as claimed in claim 11, wherein the fillet portion has an inner edge adjacent to the periphery of the semiconductor device and an outer edge opposite to the inner edge, and
    wherein each groove of the plurality of grooves is spaced apart from the inner edge and the outer edge of the fillet portion.

13. The semiconductor package as claimed in claim 11, wherein the fillet portion has an outside surface that slopes up from the surface of the package substrate to the periphery of the semiconductor device,
    wherein the groove extends from the outside surface of the fillet portion toward the surface of the package substrate in a vertical direction perpendicular to the surface of the package substrate, and
    wherein a distance between the outside surface of the fillet portion and a bottom surface of the groove in the vertical direction is smaller than a distance between the outside surface of the fillet portion and the surface of the package substrate in the vertical direction.

14. The semiconductor package as claimed in claim 11, wherein the semiconductor device comprises a plurality of corners, and
    wherein the plurality of grooves are arranged to correspond to some or all of the plurality of corners in a plan view.

15. The semiconductor package as claimed in claim 11, wherein the semiconductor device comprises a plurality of sides and a plurality of corners, and wherein the plurality of grooves are arranged along opposite sides of the plurality of sides and the plurality of corners in a plan view.

16. The semiconductor package as claimed in claim 11, wherein the semiconductor device comprises two dies arranged side by side, and a gap is formed between the two dies, and wherein the plurality of grooves are arranged corresponding to the gap in a plan view.

17. A semiconductor package, comprising:

a package substrate;

a semiconductor device disposed over a surface of the package substrate;

an underfill element formed between the semiconductor device and the surface of the package substrate, wherein the underfill element comprises a fillet portion that extends laterally beyond a periphery of the semiconductor device and is formed along the periphery of the semiconductor device; and at least one groove formed in the fillet portion, wherein the semiconductor device comprises a plurality of sides and a plurality of corners, and the at least one groove is arranged to correspond to at least one corner of the plurality of corners of the semiconductor device in a plan view, and wherein a shape of each groove of the at least one groove matches a shape of the corresponding corner of the plurality of corners in the plan view.

18. The semiconductor package as claimed in claim 17, wherein the each groove is L-shaped in the plan view.

19. The semiconductor package as claimed in claim 17, wherein the at least one groove is laterally spaced apart from the periphery of the semiconductor device.

20. The semiconductor package as claimed in claim 17, wherein a bottom surface of the at least one groove is spaced apart from the surface of the package substrate.

* * * * *